US011233183B2

(12) United States Patent
Suich et al.

(10) Patent No.: US 11,233,183 B2
(45) Date of Patent: Jan. 25, 2022

(54) LIGHT-EMITTING DIODES, LIGHT-EMITTING DIODE ARRAYS AND RELATED DEVICES

(71) Applicant: CreeLED, Inc., Durham, NC (US)

(72) Inventors: David Suich, Durham, NC (US); Arthur F. Pun, Raleigh, NC (US); Kenneth M. Davis, Raleigh, NC (US)

(73) Assignee: CreeLED, Inc., Durham, NC (US)

( * ) Notice: Subject to any disclaimer, the term of this patent is extended or adjusted under 35 U.S.C. 154(b) by 0 days.

(21) Appl. No.: 16/545,357

(22) Filed: Aug. 20, 2019

(65) Prior Publication Data

US 2020/0075822 A1 Mar. 5, 2020

Related U.S. Application Data

(63) Continuation-in-part of application No. 16/118,779, filed on Aug. 31, 2018.
(Continued)

(51) Int. Cl.
*H01L 33/60* (2010.01)
*H01L 25/075* (2006.01)
*H01L 33/50* (2010.01)

(52) U.S. Cl.
CPC .......... *H01L 33/60* (2013.01); *H01L 25/0753* (2013.01); *H01L 33/505* (2013.01); *H01L 2933/0091* (2013.01)

(58) Field of Classification Search
CPC ..... H01L 2251/5369; H01L 2251/5271–5275; H01L 2251/5284; H01L 51/5268;
(Continued)

(56) References Cited

U.S. PATENT DOCUMENTS 2,857,541 A 10/1958 Etzel et al.
4,918,497 A 4/1990 Edmond
(Continued)

FOREIGN PATENT DOCUMENTS

CN 102214651 A 10/2011
CN 103864302 A 6/2014
(Continued)

OTHER PUBLICATIONS https://web.archive.org/web/20150401161824/http://en.wikipedia.org/wiki/Black_silicon (Year: 2015).*
(Continued)

*Primary Examiner* — Matthew C Landau
*Assistant Examiner* — Eric K Ashbahian
(74) *Attorney, Agent, or Firm* — Withrow & Terranova, P.L.L.C.

(57) ABSTRACT

Light-emitting diodes (LEDs), LED arrays, and related devices are disclosed. An LED device includes a first LED chip and a second LED chip mounted on a submount with a light-altering material in between. The light-altering material may include at least one of a light-reflective material and/or a light-absorbing material. Individual wavelength conversion elements may be arranged on each of the first and second LED chips. The light-altering material may improve the contrast between the first and second LED chips as well as between the individual wavelength conversion elements. The light-altering material may include at least one of nanoparticles, nanowires, mesowires, or combinations thereof. LED devices may include submounts in modular configurations where LED chips may be mounted on adjacent submounts to form an LED array.

39 Claims, 17 Drawing Sheets

Related U.S. Application Data

(60) Provisional application No. 62/755,076, filed on Nov. 2, 2018.

(58) Field of Classification Search
CPC .............. H01L 51/5275; H01L 33/60; H01L 2933/0091; H01L 33/505; H01L 25/0753; F21K 9/68; G02B 5/22; G02B 5/003; G02B 5/26
See application file for complete search history.

(56) References Cited

U.S. PATENT DOCUMENTS

| | | |
|---|---|---|
| 4,966,862 A | 10/1990 | Edmond |
| 5,027,168 A | 6/1991 | Edmond |
| 5,177,500 A | 1/1993 | Ng |
| 5,210,051 A | 5/1993 | Carter, Jr. |
| 5,338,944 A | 8/1994 | Edmond et al. |
| 5,359,345 A | 10/1994 | Hunter |
| 5,393,993 A | 2/1995 | Edmond et al. |
| 5,416,342 A | 5/1995 | Edmond et al. |
| 5,523,589 A | 6/1996 | Edmond et al. |
| 5,604,135 A | 2/1997 | Edmond et al. |
| 5,631,190 A | 5/1997 | Negley |
| 5,739,554 A | 4/1998 | Edmond et al. |
| 5,912,477 A | 6/1999 | Negley |
| 6,034,422 A | 3/2000 | Horita et al. |
| 6,120,600 A | 9/2000 | Edmond et al. |
| 6,187,606 B1 | 2/2001 | Edmond et al. |
| 6,201,262 B1 | 3/2001 | Edmond et al. |
| 6,274,399 B1 | 8/2001 | Kern et al. |
| 6,600,175 B1 | 7/2003 | Baretz et al. |
| 6,646,330 B2 | 11/2003 | Kubara et al. |
| 6,649,440 B1 | 11/2003 | Krames et al. |
| 6,791,119 B2 | 9/2004 | Slater, Jr. et al. |
| 6,853,010 B2 | 2/2005 | Slater, Jr. et al. |
| 6,958,497 B2 | 10/2005 | Emerson et al. |
| 7,095,056 B2 | 8/2006 | Vitta et al. |
| 7,213,940 B1 | 5/2007 | Van De Ven et al. |
| 7,344,902 B2 | 3/2008 | Basin et al. |
| 7,361,938 B2 | 4/2008 | Mueller et al. |
| D572,387 S | 7/2008 | Uemoto et al. |
| D573,731 S | 7/2008 | Uemoto et al. |
| 7,456,499 B2 | 11/2008 | Loh et al. |
| 7,495,387 B2 | 2/2009 | Hayashi et al. |
| 7,564,180 B2 | 7/2009 | Brandes |
| D597,502 S | 8/2009 | Ogata et al. |
| 7,655,957 B2 | 2/2010 | Loh et al. |
| D611,628 S | 3/2010 | Uemoto et al. |
| D612,958 S | 3/2010 | Uemoto et al. |
| 7,754,507 B2 | 7/2010 | Epler et al. |
| 7,791,061 B2 | 9/2010 | Edmond et al. |
| 7,802,901 B2 | 9/2010 | McMillan |
| 7,821,023 B2 | 10/2010 | Yuan et al. |
| 7,847,303 B2 | 12/2010 | Jung et al. |
| 7,928,648 B2 | 4/2011 | Jang et al. |
| 7,952,544 B2 | 5/2011 | Roberts |
| 7,960,819 B2 | 6/2011 | Loh et al. |
| 7,999,283 B2 | 8/2011 | Chakraborty et al. |
| 8,018,135 B2 | 9/2011 | Van De Ven et al. |
| 8,044,418 B2 | 10/2011 | Loh et al. |
| 8,058,088 B2 | 11/2011 | Cannon et al. |
| 8,075,165 B2 | 12/2011 | Jiang et al. |
| 8,125,137 B2 | 2/2012 | Medendorp, Jr. et al. |
| 8,232,564 B2 | 7/2012 | Chakraborty |
| 8,264,138 B2 | 9/2012 | Negley et al. |
| 8,337,071 B2 | 12/2012 | Negley et al. |
| 8,362,512 B2 | 1/2013 | Hussell et al. |
| 8,384,097 B2 | 2/2013 | Yan |
| 8,390,022 B2 | 3/2013 | Hussell et al. |
| 8,410,679 B2 | 4/2013 | Ibbetson et al. |
| 8,425,271 B2 | 4/2013 | Hussell et al. |
| 8,563,339 B2 | 10/2013 | Tarsa et al. |
| 8,598,793 B2 | 12/2013 | Yan et al. |
| D703,841 S | 4/2014 | Feng et al. |
| 8,729,589 B2 | 5/2014 | Hussell et al. |
| 8,822,032 B2 | 9/2014 | Borrelli et al. |
| 8,866,410 B2 | 10/2014 | Negley et al. |
| 8,940,561 B2 | 1/2015 | Donofrio et al. |
| 8,970,131 B2 | 3/2015 | Brandes et al. |
| 8,998,444 B2 | 4/2015 | Roberts et al. |
| 9,024,340 B2 | 5/2015 | Minato et al. |
| 9,024,349 B2 | 5/2015 | Chitnis et al. |
| 9,053,958 B2 | 6/2015 | Donofrio et al. |
| 9,131,561 B2 | 9/2015 | Athalye |
| 9,159,888 B2 | 10/2015 | Chitnis et al. |
| 9,192,013 B1 | 11/2015 | van de Ven et al. |
| 9,277,605 B2 | 3/2016 | Ni |
| 9,310,026 B2 | 4/2016 | Negley |
| D756,547 S | 5/2016 | Zhang et al. |
| 9,414,454 B2 | 8/2016 | Brandes et al. |
| 9,461,222 B1 | 10/2016 | Wei |
| 9,713,211 B2 | 7/2017 | van de Ven et al. |
| D797,321 S | 9/2017 | Liu |
| 9,816,691 B2 | 11/2017 | Yan |
| 9,893,243 B2 | 2/2018 | West et al. |
| 10,057,983 B1 | 8/2018 | Etzkorn et al. |
| 10,211,187 B2 | 2/2019 | Crompvoets et al. |
| D851,790 S | 6/2019 | Reiherzer et al. |
| 10,651,353 B2 | 5/2020 | Senuki et al. |
| 2004/0048219 A1 | 3/2004 | Yun |
| 2005/0127385 A1 | 6/2005 | Reeh et al. |
| 2006/0221272 A1 | 10/2006 | Negley et al. |
| 2007/0104828 A1 | 5/2007 | Fornaguera |
| 2007/0241661 A1 | 10/2007 | Yin |
| 2008/0036940 A1 | 2/2008 | Song et al. |
| 2008/0258130 A1 | 10/2008 | Bergmann et al. |
| 2009/0001490 A1 | 1/2009 | Bogner et al. |
| 2009/0021841 A1 | 1/2009 | Negley et al. |
| 2009/0039375 A1 | 2/2009 | LoToquin et al. |
| 2009/0050908 A1 | 2/2009 | Yuan et al. |
| 2009/0051022 A1 | 2/2009 | Andoh |
| 2009/0166665 A1 | 7/2009 | Haitko |
| 2009/0261708 A1 | 10/2009 | Moser et al. |
| 2009/0267090 A1* | 10/2009 | Chang ................ H01L 25/0753 257/89 |
| 2009/0316409 A1 | 12/2009 | Kim et al. |
| 2010/0154035 A1 | 6/2010 | Damola et al. |
| 2010/0244060 A1 | 9/2010 | Lee et al. |
| 2010/0320928 A1 | 12/2010 | Kaihotsu et al. |
| 2011/0018017 A1 | 1/2011 | Bierhuizen et al. |
| 2011/0031516 A1 | 2/2011 | Basin et al. |
| 2011/0049545 A1 | 3/2011 | Basin et al. |
| 2011/0068702 A1 | 3/2011 | van de Ven et al. |
| 2011/0169033 A1 | 7/2011 | Fukunga et al. |
| 2011/0180822 A1 | 7/2011 | Ruhnau et al. |
| 2011/0254022 A1 | 10/2011 | Sasano |
| 2011/0309388 A1 | 12/2011 | Ito et al. |
| 2012/0061692 A1 | 3/2012 | Chang et al. |
| 2012/0086023 A1 | 4/2012 | Veerasamy et al. |
| 2012/0104452 A1 | 5/2012 | Miyoshi et al. |
| 2012/0107622 A1 | 5/2012 | Borrelli et al. |
| 2012/0111471 A1 | 5/2012 | Negley et al. |
| 2012/0193651 A1 | 8/2012 | Edmond et al. |
| 2012/0305949 A1 | 12/2012 | Donofrio et al. |
| 2012/0306355 A1 | 12/2012 | Seibel, II |
| 2013/0033169 A1 | 2/2013 | Ito et al. |
| 2013/0057593 A1 | 3/2013 | Morishita |
| 2013/0069781 A1 | 3/2013 | Terwilliger et al. |
| 2013/0077299 A1 | 3/2013 | Hussell et al. |
| 2013/0092960 A1 | 4/2013 | Wilcox et al. |
| 2013/0221509 A1 | 8/2013 | Oda et al. |
| 2013/0256710 A1 | 10/2013 | Andrews et al. |
| 2013/0256711 A1 | 10/2013 | Joo et al. |
| 2013/0264589 A1 | 10/2013 | Bergmann et al. |
| 2013/0271991 A1 | 10/2013 | Hussell et al. |
| 2013/0301257 A1 | 11/2013 | Britt et al. |
| 2014/0138725 A1 | 5/2014 | Oyamada |
| 2014/0217325 A1 | 8/2014 | Manabe et al. |
| 2014/0217435 A1 | 8/2014 | Bergmann et al. |
| 2014/0217436 A1 | 8/2014 | Hussell et al. |
| 2014/0217443 A1 | 8/2014 | Heikman et al. |
| 2014/0239320 A1 | 8/2014 | Miyoshi et al. |
| 2014/0367713 A1 | 12/2014 | Zhang et al. |

(56) References Cited

U.S. PATENT DOCUMENTS

| | | | |
|---|---|---|---|
| 2015/0028372 A1 | 1/2015 | Nakanishi et al. | |
| 2015/0062915 A1 | 3/2015 | Hussell et al. | |
| 2015/0155447 A1 | 6/2015 | Beppu | |
| 2015/0204525 A1 | 7/2015 | Shen et al. | |
| 2015/0207045 A1 | 7/2015 | Wada et al. | |
| 2015/0249196 A1 | 9/2015 | Williams et al. | |
| 2015/0257211 A1 | 9/2015 | Johnson et al. | |
| 2015/0262987 A1 | 9/2015 | Wada et al. | |
| 2015/0263247 A1 | 9/2015 | Wada et al. | |
| 2015/0349218 A1 | 12/2015 | Reiherzer et al. | |
| 2015/0364660 A1* | 12/2015 | Huang | H01L 33/505 257/98 |
| 2016/0064623 A1 | 3/2016 | Clatterbuck | |
| 2016/0074833 A1* | 3/2016 | O'Brien | C07C 9/04 204/157.52 |
| 2016/0079486 A1 | 3/2016 | Sugimoto et al. | |
| 2016/0093777 A1 | 3/2016 | Sato et al. | |
| 2016/0111600 A1 | 4/2016 | Chae et al. | |
| 2016/0126010 A1 | 5/2016 | Wang | |
| 2016/0126434 A1* | 5/2016 | Nakabayashi | F21S 41/153 315/82 |
| 2016/0161098 A1 | 6/2016 | Tudorica et al. | |
| 2016/0293811 A1 | 10/2016 | Hussell et al. | |
| 2016/0351846 A1 | 12/2016 | Kim et al. | |
| 2017/0040183 A1 | 2/2017 | Sakai et al. | |
| 2017/0092820 A1 | 3/2017 | Kim et al. | |
| 2017/0098746 A1 | 4/2017 | Bergmann et al. | |
| 2017/0154880 A1 | 6/2017 | Ozeki et al. | |
| 2017/0263828 A1 | 9/2017 | Mao et al. | |
| 2017/0294417 A1 | 10/2017 | Edmond et al. | |
| 2017/0299798 A1 | 10/2017 | Son | |
| 2017/0301832 A1* | 10/2017 | Basin | H01L 33/60 |
| 2017/0358624 A1 | 12/2017 | Takeya et al. | |
| 2017/0373225 A1 | 12/2017 | Shichijo et al. | |
| 2018/0012949 A1 | 1/2018 | Takeya et al. | |
| 2018/0033924 A1 | 2/2018 | Andrews et al. | |
| 2018/0043178 A1 | 2/2018 | Iguchi et al. | |
| 2018/0069164 A1 | 3/2018 | Minato et al. | |
| 2018/0076368 A1 | 3/2018 | Hussell | |
| 2018/0102348 A1 | 4/2018 | Haiberger et al. | |
| 2018/0102449 A1* | 4/2018 | Pschenitzka | H01L 27/14621 |
| 2018/0103513 A1 | 4/2018 | Tseng et al. | |
| 2018/0130776 A1 | 5/2018 | Oka | |
| 2018/0190880 A1 | 7/2018 | Vampola et al. | |
| 2018/0190881 A1 | 7/2018 | Lin | |
| 2018/0190885 A1 | 7/2018 | Chang et al. | |
| 2019/0122592 A1 | 4/2019 | Han et al. | |
| 2019/0148346 A1 | 5/2019 | Feichtinger et al. | |
| 2019/0165231 A1 | 5/2019 | Doan et al. | |
| 2019/0237638 A1 | 8/2019 | Andrews et al. | |
| 2019/0312187 A1* | 10/2019 | Harada | H01L 25/0753 |
| 2020/0152840 A1 | 5/2020 | Hussell | |

FOREIGN PATENT DOCUMENTS

| | | |
|---|---|---|
| CN | 204088306 U | 1/2015 |
| EP | 1710846 A1 | 10/2006 |
| EP | 2216834 A1 | 8/2010 |
| EP | 2819191 A1 | 2/2013 |
| EP | 2768037 A1 | 8/2014 |
| EP | 2804225 A1 | 11/2014 |
| EP | 2927970 A1 | 10/2015 |
| WO | 2007034367 A1 | 3/2007 |
| WO | 2011007275 A1 | 1/2011 |
| WO | 2012058040 A1 | 5/2012 |
| WO | 2013154818 A1 | 10/2013 |
| WO | 2014024108 A1 | 2/2014 |
| WO | 2014133294 A1 | 9/2014 |
| WO | 2014159894 A1 | 10/2014 |
| WO | 2015026033 A1 | 2/2015 |
| WO | 2018022456 A1 | 2/2018 |

OTHER PUBLICATIONS

Nichia Corporation, "NC3W321 At: Specifications for White LED," Nichia STS-DA1-4281A <Cat.No.160603>, [online], [retrieved on May 21, 2018] Retrieved from Nichia Corporation using Internet <URL: http://www.nichia.co.jp/en/product/led.html>, 16 pages.

Nichia Corporation, "NC2W321 At: Specifications for White LED," Nichia STS-DA1-4323A <Cat.No.160711 >, [online], [retrieved on May 21, 2018] Retrieved from Nichia Corporation using Internet <URL: http://www.nichia.co.jp/en/product/led.html>, 16 pages.

Nichia Corporation, "NC4W321 At: Specifications for White Led," Nichia STS-DA1-4325A <Cat.No. 160711 >, [online], [retrieved on May 21, 2018] Retrieved from Nichia Corporation using Internet <URL: http://www.nichia.co.jp/en/product/led.html>, 16 pages.

International Search Report and Written Opinion for International Patent Application No. PCT/US2017/043316, dated Sep. 1, 2017, 13 pages.

Non-Final Office Action for U.S. Appl. No. 15/657,027, dated Apr. 10, 2018, 11 pages.

Final Office Action for U.S. Appl. No. 15/657,027, dated Oct. 19, 2018, 17 pages.

Notice of Allowance for U.S. Appl. No. 15/657,027, dated Dec. 28, 2018, 9 pages.

International Preliminary Report on Patentability for International Patent Application No. PCT/US2017/043316, dated Feb. 7, 2019, 9 pages.

Invitation to Pay Additional Fees and Partial International Search for International Patent Application No. PCT/US2019/028704, dated Jul. 17, 2019, 14 pages.

Invitation to Pay Additional Fees and Partial International Search for International Patent Application No. PCT/US2019/028708, dated Jul. 17, 2019, 17 pages.

Non-Final Office Action for U.S. Appl. No. 16/380,400, dated Sep. 9, 2019, 13 pages.

International Search Report and Written Opinion for International Patent Application No. PCT/US2019/028704, dated Sep. 9, 2019, 18 pages.

Non-Final Office Action for U.S. Appl. No. 16/118,762, dated Oct. 1, 2019, 36 pages.

International Search Report and Written Opinion for International Patent Application No. PCT/US2019/028708, dated Sep. 9, 2019, 20 pages.

Dupont, "DuPont™ Ti-Pure® titanium dioxide: Titanium Dioxide for Coatings," Product Brochure H-65969-2, Jun. 2007, 28 pages.

Non-Final Office Action for U.S. Appl. No. 16/118,747, dated Jan. 29, 2020, 28 pages.

Final Office Action for U.S. Appl. No. 16/118,762, dated Feb. 14, 2020, 44 pages.

Non-Final Office Action for U.S. Appl. No. 16/118,779, dated Jan. 10, 2020, 27 pages.

Examination Report for European Patent Application No. 17748998. 6, dated Jan. 3, 2020, 7 pages.

Notice of Allowance for U.S. Appl. No. 16/380,400, dated Mar. 17, 2020, 8 pages.

Restriction Requirement for U.S. Appl. No. 29/661,900, dated Nov. 25, 2019, 6 pages.

Notice of Allowance for U.S. Appl. No. 16/380,400, dated Nov. 27, 2019, 8 pages.

International Search Report and Written Opinion for International Patent Application No. PCT/US2020/038960, dated Aug. 11, 2020, 17 pages.

Advisory Action for U.S. Appl. No. 16/118,747, dated Aug. 18, 2020, 3 pages.

Advisory Action and Applicant-Initiated Interview Summary for U.S. Appl. No. 16/118,747, dated Aug. 24, 2020, 5 pages.

Non-Final Office Action for U.S. Appl. No. 16/118,747, dated Sep. 8, 2020, 32 pages.

Non-Final Office Action for U.S. Appl. No. 16/380,400, dated Jul. 27, 2020, 12 pages.

Notice of Allowance for U.S. Appl. No. 16/797,173, dated Aug. 24, 2020, 9 pages.

Final Office Action for U.S. Appl. No. 16/118,747, dated Jun. 9, 2020, 43 pages.

(56) References Cited

OTHER PUBLICATIONS

Advisory Action, Applicant-Initiated Interview Summary, and AFCP 2.0 Decision for U.S. Appl. No. 16/118,762, dated Apr. 24, 2020, 9 pages.
Non-Final Office Action for U.S. Appl. No. 16/118,762, dated May 26, 2020, 25 pages.
Final Office Action for U.S. Appl. No. 16/118,779, dated Jul. 16, 2020, 35 pages.
Notice of Allowance for U.S. Appl. No. 16/797,173, dated Jun. 22, 2020, 10 pages.
Examination Report for European Patent Application No. 17748998.6, dated Jun. 25, 2020, 7 pages.
Notice of Allowance for U.S. Appl. No. 29/661,900, dated Apr. 29, 2020, 6 pages.
Advisory Action and Applicant-Initiated Interview Summary for U.S. Appl. No. 16/118,779, dated Nov. 20, 2020, 5 pages.
Non-Final Office Action for U.S. Appl. No. 16/453,447, dated Dec. 22, 2020, 19 pages.
Notice of Allowance for U.S. Appl. No. 16/380,400, dated Oct. 28, 2020, 9 pages.
International Preliminary Report on Patentability for International Patent Application No. PCT/US2019/028704, dated Dec. 10, 2020, 11 pages.
International Preliminary Report on Patentability for International Patent Application No. PCT/US2019/028708, dated Dec. 10, 2020, 12 pages.
Notice of Allowance for U.S. Appl. No. 16/118,747, dated Jan. 6, 2021, 8 pages.
Final Office Action for U.S. Appl. No. 16/118,762, dated Jan. 4, 2021, 20 pages.
Non-Final Office Action for U.S. Appl. No. 16/118,779, dated Jan. 22, 2021, 27 pages.
Examination Report for European Patent Application No. 17748998.6, dated Feb. 4, 2021, 6 pages.
Notice of Allowance for U.S. Appl. No. 16/453,447, dated May 14, 2021, 9 pages.
Corrected Notice of Allowability for U.S. Appl. No. 16/453,447, dated Jun. 23, 2021, 6 pages.
Final Office Action for U.S. Appl. No. 16/118,779, dated Jul. 15, 2021, 25 pages.
First Office Action for Chinese Patent Application No. 2017800585182, dated Jan. 27, 2021, 15 pages.
Advisory Action and Applicant-Initiated Interview Summary for U.S. Appl. No. 16/118,762, dated Mar. 22, 2021, 5 pages.
Notice of Allowance for U.S. Appl. No. 16/118,762, dated Apr. 16, 2021, 8 pages.
Advisory Action for U.S. Appl. No. 16/118,779, dated Sep. 23, 2021, 3 pages.
Notice of Allowance for U.S. Appl. No. 16/118,779, dated Oct. 27, 2021, 8 pages.
Summons to Attend Oral Proceedings for European Patent Application No. 17748998.6, dated Oct. 6, 2021, 10 pages.

* cited by examiner

LIGHT-EMITTING DIODES, LIGHT-EMITTING DIODE ARRAYS AND RELATED DEVICES

RELATED APPLICATIONS

This application claims priority to provisional patent application Ser. No. 62/755,076, filed on Nov. 2, 2018, and is a continuation-in-part of U.S. patent application Ser. No. 16/118,779, filed on Aug. 31, 2018, entitled "LIGHT-EMITTING DIODES, LIGHT-EMITTING DIODE ARRAYS AND RELATED DEVICES," the disclosures of which are hereby incorporated herein by reference in their entireties.

FIELD OF THE DISCLOSURE

The present disclosure relates to solid-state lighting devices including light-emitting diodes, light-emitting diode arrays, and devices incorporating light-emitting diodes or light-emitting diode arrays.

BACKGROUND

Solid-state lighting devices such as light-emitting diodes (LEDs) are increasingly used in both consumer and commercial applications. Advancements in LED technology have resulted in highly efficient and mechanically robust light sources with a long service life. Accordingly, modern LEDs have enabled a variety of new display applications and are being increasingly utilized for general illumination applications, often replacing incandescent and fluorescent light sources.

LEDs are solid-state devices that convert electrical energy to light and generally include one or more active layers of semiconductor material (or an active region) arranged between oppositely doped n-type and p-type layers. When a bias is applied across the doped layers, holes and electrons are injected into the one or more active layers where they recombine to generate emissions such as visible light or ultraviolet emissions. An LED chip typically includes an active region that may be fabricated, for example, from silicon carbide, gallium nitride, gallium phosphide, aluminum nitride, gallium arsenide-based materials, and/or from organic semiconductor materials. Photons generated by the active region are initiated in all directions.

LEDs have been widely adopted in various illumination contexts, for backlighting of liquid crystal display (LCD) systems (e.g., as a substitute for cold cathode fluorescent lamps), and for sequentially illuminated LED displays. Applications utilizing LED arrays include vehicular headlamps, roadway illumination, light fixtures, and various indoor, outdoor, and specialty contexts. Desirable characteristics of LED devices include high luminous efficacy, long lifetime, and wide color gamut. In such LED array applications, it may be desirable to have LEDs spaced more closely together in order for the array to appear as a uniform emission area when all LEDs are electrically activated, or turned on. However, when some LEDs of the LED array are turned off, or electrically deactivated, it may be challenging to provide good contrast between LEDs in an on-state relative to LEDs in an off-state. This is due in part to the omnidirectional character of LED emissions, which can make it difficult to prevent emissions of one LED from significantly overlapping with emissions of another LED of an array, thereby resulting in crosstalk or light spillage between emissions of adjacent LEDs. Significant overlap between beams emitted by adjacent LEDs tends to impair the effective resolution of a LED array device; however, attempts to segregate light beams may result in undesirable non-illuminated or "dark" zones between adjacent LEDs, and may also impair brightness of aggregate emissions. It may be challenging to provide LED array devices that address the foregoing issues in combination.

The art continues to seek improved LEDs and solid-state lighting devices having reduced optical losses and providing desirable illumination characteristics capable of overcoming challenges associated with conventional lighting devices.

SUMMARY

Aspects disclosed herein relate to light-emitting diodes (LEDs), LED arrays, and related devices. An LED device includes a first LED chip and a second LED chip mounted on a submount with a light-altering material between the first LED chip and the second LED chip. The light-altering material may include at least one or more of a light-reflective material and a light-absorbing material. In certain embodiments, the light-altering material may include at least one of nanoparticles, nanowires, mesoparticles, mesowires, or combinations thereof. Individual wavelength conversion elements may be arranged on each of the first LED chip and the second LED chip. The light-altering material may improve contrast between the first LED chip and the second LED chip as well as between the individual wavelength conversion elements. LED devices may include submounts with at least one electrically conductive anode or cathode path that is discontinuous on a surface of the submount where LED chips are mounted. LED devices may include submounts in modular configurations where LED chips may be mounted on adjacent submounts to form an LED array. Each LED chip of the LED array may be laterally separated from at least one other LED chip by a same distance, and a light-altering material may be arranged around the LED array.

In one aspect, an LED device comprises: a submount; a first LED chip on a surface of the submount; a first light-altering material arranged around a perimeter of the first LED chip, wherein the first light-altering material comprises at least one of a plurality of nanowires or a plurality of mesowires in a binder. In certain embodiments, the plurality of nanowires comprises silicon nanowires or the plurality of mesowires comprises silicon mesowires. The first light-altering material may further comprise at least one of a nanopowder or a mesopowder. A total weight percent of the plurality of nanowires, the plurality of mesowires, the nanopowder, or the mesopowder may include a range of about greater than 0% to about 15% of a total weight of the first light-altering material. The first light-altering material may further comprise at least one of fused silica, fumed silica, titanium dioxide ($TiO_2$), or metal particles in the binder. In certain embodiments, the LED device may further comprise a first wavelength conversion element registered with the first LED chip, wherein the first wavelength conversion element comprises a first superstrate and a first lumiphoric material that is arranged between the first superstrate and the first LED chip. The first light-altering material may be further arranged around a perimeter of the first wavelength conversion element. In certain embodiments, the LED device may further comprise a second LED chip on the surface of the submount and wherein the first light-altering material is arranged between the first LED chip and the second LED chip.

In another aspect, an LED device comprises: a submount; a first LED chip and a second LED chip on a surface of the submount, wherein the first LED chip is laterally separated from the second LED chip on the surface; and a first light-altering material arranged between the first LED chip and the second LED chip on the submount, wherein the first light-altering material comprises a plurality of nanoparticles in a binder. In certain embodiments, the plurality of nanoparticles comprises silicon nanoparticles. The plurality of nanoparticles may comprise shapes including one or more combinations of wires, spheres, ovals, cubes, pyramids, and asymmetric shapes. A total weight percent of the plurality of nanoparticles may comprise a range of about greater than 0% to about 15% of a total weight of the first light-altering material. The first light-altering material may further comprises at least one of fused silica, fumed silica, titanium dioxide (TiO$_2$), or metal particles in the binder. In certain embodiments, the first light-altering material is arranged around an entire perimeter of the first LED chip and around an entire perimeter of the second LED chip. The LED device may further comprise: a first wavelength conversion element registered with the first LED chip, wherein the first wavelength conversion element comprises a first superstrate and a first lumiphoric material that is arranged between the first superstrate and the first LED chip; and a second wavelength conversion element registered with the second LED chip, wherein the second wavelength conversion element comprises a second superstrate and a second lumiphoric material that is arranged between the second superstrate and the second LED chip. In certain embodiments, the first light-altering material is further arranged between the first wavelength conversion element and the second wavelength conversion element.

In another aspect, and LED device comprises: a submount; a first LED chip and a second LED chip on a surface of the submount, wherein the first LED chip is laterally separated from the second LED chip on the surface; and a first light-altering material arranged between the first LED chip and the second LED chip on the submount, wherein the first light-altering material comprises: a binder comprising a first index of refraction; one or more first particles comprising a second index of refraction; and one or more second particles comprising an third index of refraction; wherein the second index of refraction is at least two times greater than the first index of refraction, and the third index of refraction is at least two and a half times greater than the first index of refraction. In certain embodiments, the second index of refraction is in a range of at least two times greater to about three times greater than the first index of refraction, and the third index of refraction is in a range of at least two and a half times greater to about four times greater than the first index of refraction. The one or more first particles may comprise at least one of fused silica, fumed silica, or titanium dioxide, or combinations thereof. The one or more second particles comprise at least one of nanowires or mesowires, or combinations thereof. In certain embodiments, the one or more second particles may comprise at least one of nanoparticles or mesoparticles. In certain embodiments, the first light-altering material is arranged around an entire perimeter of the first LED chip and around an entire perimeter of the second LED chip. The first light-altering material may further comprise metal particles.

In another aspect, an LED device comprises: a submount; a first LED chip and a second LED chip on a surface of the submount, wherein the first LED chip is laterally separated from the second LED chip on the surface; and a light-altering material arranged between the first LED chip and the second LED chip on the submount, wherein the light-altering material comprises: a binder; one or more first particles configured to substantially refract light emitted from the first LED chip and the second LED chip; and one or more second particles configured to refract light and absorb light emitted from the first LED chip and the second LED chip. In certain embodiments, the one or more first particles comprise at least one of fused silica, fumed silica, or titanium dioxide (TiO$_2$). In certain embodiments, the one or more second particles comprise at least one of nanowires, mesowires, nanoparticles, mesoparticles, nanopowder, or mesopowder. The light-altering material may further comprise one or more third particles configured to substantially reflect light emitted from the first LED chip and the second LED chip. The one or more third particles may comprise metal particles. In certain embodiments, the one or more first particles comprise a reflectance percentage in a range from about 80% to about 100% for light emitted from the first LED chip and the second LED chip. In certain embodiments, the one or more second particles comprise a reflectance percentage in a range from about 20% to about 70% for light emitted from the first LED chip and the second LED chip. The one or more first particles may comprise a weight percent that is in a range of about 10% to about 90%, in a range from about 25% to about 70% of a total weight of the light-altering material. The one or more second particles may comprise a weight percent that is in a range of about greater than 0% to about 15%, or in a range of about greater than 0% to about 10%, in a range of about greater than 0% to about 5%, or in a range of about greater than 0% to about 1% of a total weight of the light-altering material.

In another aspect, any of the foregoing aspects, and/or various separate aspects and features as described herein, may be combined for additional advantage. Any of the various features and elements as disclosed herein may be combined with one or more other disclosed features and elements unless indicated to the contrary herein.

Those skilled in the art will appreciate the scope of the present disclosure and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the disclosure, and together with the description serve to explain the principles of the disclosure.

DETAILED DESCRIPTION

Figure 1A:
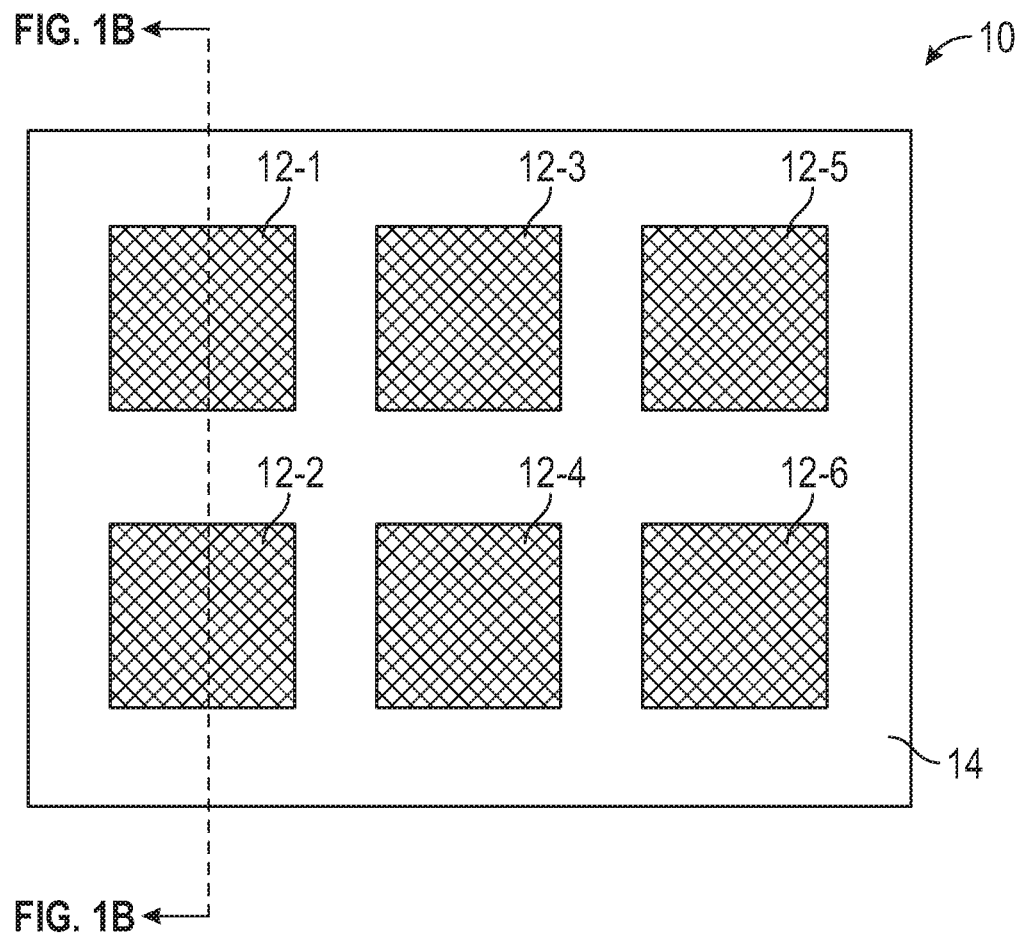
FIG. 1A is a top view of an LED device with a plurality of LED chips arranged on a submount.

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

It will be understood that when an element such as a layer, region, or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. Likewise, it will be understood that when an element such as a layer, region, or substrate is referred to as being "over" or extending "over" another element, it can be directly over or extend directly over the other element or intervening elements may also be present. In contrast, when an element is referred to as being "directly over" or extending "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" may be used herein to describe a relationship of one element, layer, or region to another element, layer, or region as illustrated in the Figures. It will be understood that these terms and those discussed above are intended to encompass different orientations of the device in addition to the orientation depicted in the Figures.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

Aspects disclosed herein relate to light-emitting diodes (LEDs), LED arrays, and related devices. An LED device includes a first LED chip and a second LED chip mounted on a submount with a light-altering material between the first LED chip and the second LED chip. The light-altering material may include at least one or more of a light-reflective material and a light-absorbing material. In certain embodiments, the light-altering material may include at least one of nanoparticles, nanowires, mesoparticles, or mesowires. Individual wavelength conversion elements may be arranged on each of the first LED chip and the second LED chip. The light-altering material may improve contrast between the first LED chip and the second LED chip as well as between the individual wavelength conversion elements. LED devices may include submounts with at least one electrically conductive anode or cathode path that is discontinuous on a surface of the submount where LED chips are mounted. LED devices may include submounts in modular configurations where LED chips may be mounted on adjacent submounts to form an LED array. Each LED chip of the LED array may be laterally separated from at least one other LED chip by a same distance, and a light-altering material may be arranged around the LED array.

An LED chip typically comprises an active LED structure or region that can have many different semiconductor layers arranged in different ways. The fabrication and operation of LEDs and their active structures are generally known in the art and are only briefly discussed herein. The semiconductor layers of the active LED structure can be fabricated using known processes with a suitable process being fabrication using metal organic chemical vapor deposition. The semiconductor layers of the active LED structure can comprise many different layers and generally comprise an active layer sandwiched between n-type and p-type oppositely doped epitaxial layers, all of which are formed successively on a growth substrate. It is understood that additional layers and elements can also be included in the active LED structure, including but not limited to: buffer layers, nucleation layers, super lattice structures, un-doped layers, cladding layers, contact layers, current-spreading layers, and light extraction layers and elements. The active layer can comprise a single quantum well, a multiple quantum well, a double heterostructure, or super lattice structures.

The active LED structure can be fabricated from different material systems, with some material systems being Group III nitride-based material systems. Group III nitrides refer to those semiconductor compounds formed between nitrogen and the elements in Group III of the periodic table, usually aluminum (Al), gallium (Ga), and indium (In). Gallium nitride (GaN) is a common binary compound. Group III nitrides also refer to ternary and quaternary compounds such as aluminum gallium nitride (AlGaN), indium gallium nitride (InGaN), and aluminum indium gallium nitride (AlInGaN). For Group III nitrides, silicon (Si) is a common n-type dopant and magnesium (Mg) is a common p-type dopant. Accordingly, the active layer, n-type layer, and p-type layer may include one or more layers of GaN, AlGaN, InGaN, and AlInGaN that are either undoped or doped with Si or Mg for a material system based on Group III nitrides. Other material systems include silicon carbide (SiC), organic semiconductor materials, and other Group III-V systems such as gallium phosphide (GaP), gallium arsenide (GaAs), and related compounds.

The active LED structure may be grown on a growth substrate that can include many materials, such as sapphire, SiC, aluminum nitride (AlN), GaN, with a suitable substrate being a 4H polytype of SiC, although other SiC polytypes can also be used including 3C, 6H, and 15R polytypes. SiC has certain advantages, such as a closer crystal lattice match to Group III nitrides than other substrates and results in Group III nitride films of high quality. SiC also has a very high thermal conductivity so that the total output power of Group III nitride devices on SiC is not limited by the thermal dissipation of the substrate. Sapphire is another common substrate for Group III nitrides and also has certain advantages including being lower cost, having established manufacturing processes, and having good light transmissive optical properties.

Different embodiments of the active LED structure can emit different wavelengths of light depending on the composition of the active layer and n-type and p-type layers. In certain embodiments, the active LED structure emits a blue light in a peak wavelength range of approximately 430 nanometers (nm) to 480 nm. In other embodiments, the active LED structure emits green light in a peak wavelength range of 500 nm to 570 nm. In other embodiments, the active LED structure emits red light in a peak wavelength range of 600 nm to 650 nm. The LED chip can also be covered with one or more lumiphors or other conversion materials, such as phosphors, such that at least some of the light from the LED chip passes through the one or more phosphors and is converted to one or more different wavelengths of light. In certain embodiments, the LED chip emits a generally white light combination of light from the active LED structure and light from the one or more phosphors. The one or more phosphors may include yellow (e.g., YAG:Ce), green (LuAg:Ce), and red ($Ca_{1-x-y}Sr_xEu_yAlSiN_3$) emitting phosphors, and combinations thereof.

In certain embodiments, a wavelength conversion element includes one or more lumiphors or a lumiphoric material that is disposed on a superstrate. The term "superstrate" as used herein refers to an element placed on an LED chip with a lumiphoric material between the superstrate and the LED chip. The term "superstrate" is used herein, in part, to avoid confusion with other substrates that may be part of the semiconductor light emitting device, such as a growth or carrier substrate of the LED chip or a submount of an LED package. The term "superstrate" is not intended to limit the orientation, location, and/or composition of the structure it describes. In certain embodiments, the superstrate may be composed of, for example, sapphire, SiC, silicone, and/or glass (e.g., borosilicate and/or fused quartz). The superstrate may be patterned to enhance light extraction from the LED chip as described in commonly-assigned U.S. Provisional Application No. 62/661,359 entitled "Semiconductor Light Emitting Devices Including Superstrates With Patterned Surfaces" which is hereby incorporated by reference herein. The superstrate may also be configured as described in commonly-assigned U.S. Patent Application Publication No. 2018/0033924, also incorporated by reference herein. The superstrate may be formed from a bulk substrate which is optionally patterned and then singulated. In certain embodiments, the patterning of the superstrate may be performed by an etching process (e.g., wet or dry etching). In certain embodiments, the patterning of the superstrate may be performed by otherwise altering the surface, such as by a laser or saw. In certain embodiments, the superstrate may be thinned before or after the patterning process is performed. The lumiphoric material may then be placed on the superstrate by, for example, spraying and/or otherwise coating the superstrate with the lumiphoric material. The superstrate and the lumiphoric material may be attached to the LED chip using, for example, a layer of transparent adhesive. In certain embodiments, when the superstrate is attached to the LED chip, a portion of the transparent adhesive is positioned at least partially between lateral edges of the LED chip. In certain embodiments, a single wavelength conversion element may cover multiple LED chips. In other embodiments, individual wavelength conversion elements may be registered with individual LED chips.

The present disclosure can include LED chips having a variety of geometries, such as vertical geometry or lateral geometry. A vertical geometry LED chip typically includes an anode and cathode on opposing sides of the active LED structure. A lateral geometry LED chip typically includes an anode and a cathode on the same side of the active LED structure that is opposite a substrate, such as a growth substrate or a carrier substrate. In certain embodiments, a lateral geometry LED chip may be mounted on a submount of an LED package such that the anode and cathode are on a face of the active LED structure that is opposite the submount. In this configuration, wire bonds may be used to provide electrical connections with the anode and cathode. In other embodiments, a lateral geometry LED chip may be flip-chip mounted on a submount of an LED package such that the anode and cathode are on a face of the active LED structure that is adjacent to the submount. In this configuration, electrical traces or patterns may be provided on the submount for providing electrical connections to the anode and cathode of the LED chip. In a flip-chip configuration, the active LED structure is configured between the substrate of the LED chip and the submount for the LED package. Accordingly, light emitted from the active LED structure may pass through the substrate in a desired emission direction. In certain embodiments, the flip-chip LED chip may be configured as described in commonly-assigned U.S. Patent Application Publication No. 2017/0098746, which is hereby incorporated by reference herein.

Embodiments of the disclosure are described herein with reference to cross-sectional view illustrations that are schematic illustrations of embodiments of the disclosure. As such, the actual thickness of the layers can be different, and variations from the shapes of the illustrations as a result, for example, of manufacturing techniques and/or tolerances, are expected. For example, a region illustrated or described as square or rectangular can have rounded or curved features, and regions shown as straight lines may have some irregularity. Thus, the regions illustrated in the figures are schematic and their shapes are not intended to illustrate the precise shape of a region of a device and are not intended to limit the scope of the disclosure.

Figure 1B:
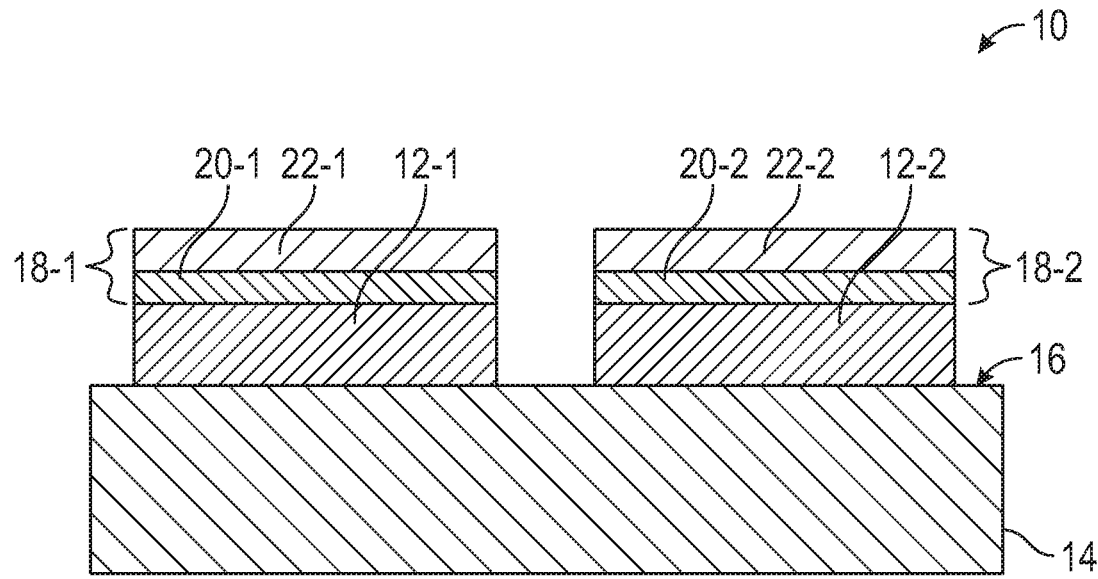
FIG. 1B is a side cross-sectional view taken along the section line of the LED device of FIG. 1A.

FIG. 1A is a top view of an LED device 10 with a plurality of LED chips 12-1 to 12-6 arranged on a submount 14. While the LED device 10 is illustrated with six LED chips 12-1 to 12-6, any number of LED chips are possible. In certain embodiments, LED devices according to embodiments disclosed herein may include an array of LED chips with as few as two LED chips or as many as one hundred LED chips or more. The submount 14 can be formed of many different materials with an exemplary material being electrically insulating. Suitable materials include, but are not limited to ceramic materials such as aluminum oxide or alumina, AlN, or organic insulators like polyimide (PI) and polyphthalamide (PPA). In other embodiments, the submount 14 can comprise a printed circuit board (PCB), sapphire, Si or any other suitable material. For PCB embodiments, different PCB types can be used such as a standard FR-4 PCB, a metal core PCB, or any other type of PCB. FIG. 1B is a side cross-sectional view taken along the section line of the LED device 10 of FIG. 1A. As illustrated, the LED chip 12-1 and the LED chip 12-2 are laterally separated on a first surface 16 of the submount 14. A first wavelength conversion element 18-1 is registered with the first LED chip 12-1, and a second wavelength conversion element 18-2 is registered with the second LED chip 12-2. The first wavelength conversion element 18-1 may include a first lumiphoric material 20-1 and a first superstrate 22-1, and the second wavelength conversion element 18-2 may include a second lumiphoric material 20-2 and a second superstrate 22-2. In certain embodiments, the first lumiphoric material 20-1 and the second lumiphoric material 20-2 are respectively disposed on the first superstrate 22-1 and the second superstrate 22-2. Notably, in this configuration, the lumiphoric materials 20-1, 20-2 are not located in the space between the LED chips 12-1, 12-2 on the submount 14, thereby reducing light conversion and improving contrast between the LED chips 12-1, 12-2. Light emitted from an active region of an LED structure or light that is converted by a lumiphoric material is typically omnidirectional in nature. Accordingly, a portion of light emitted from either the first LED chip 12-1 or converted by the first lumiphoric material 20-1 may travel laterally toward the second LED chip 12-2. In this regard, some light from the first LED chip 12-1 may bleed over to the relative position of the second LED chip 12-2 and decrease contrast between the two LED chips 12-1, 12-2. Additionally, at least some of the lateral light from one of the LED chips 12-1, 12-2 may be lost to absorption within the other of the LED chips 12-1, 12-2. In some applications, it may be desirable for a combined emission area between the two LED chips 12-1, 12-2 to appear as a uniform emission area. However, in other applications, such as those where each of the LED chips 12-1, 12-2 can be electrically activated (turned on) or electrically de-activated (turned off) independently of each other, the contrast between the LED chips 12-1, 12-2 may be lower than what is desired.

Figure 2A:
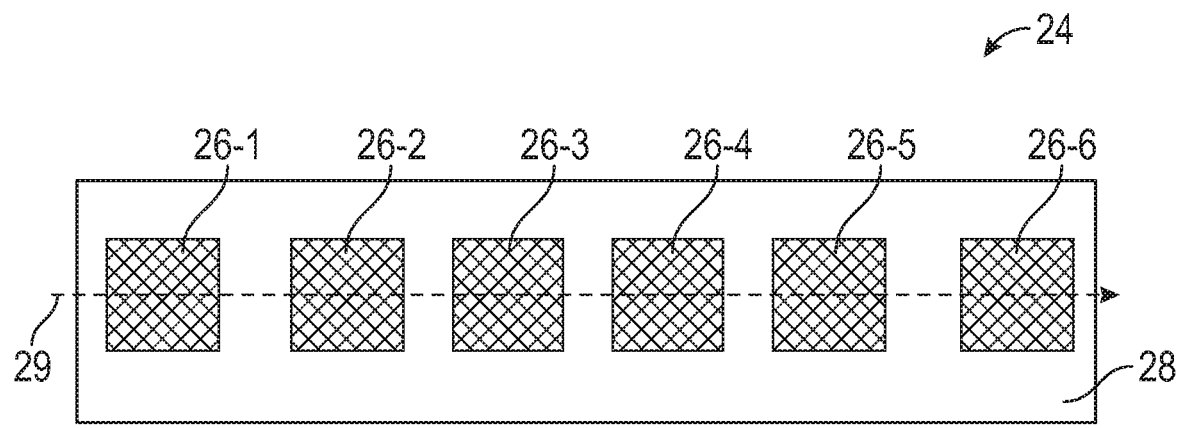
FIG. 2A is top view of an LED device with a plurality of LED chips arranged on a submount as previously described.
Figure 2B:
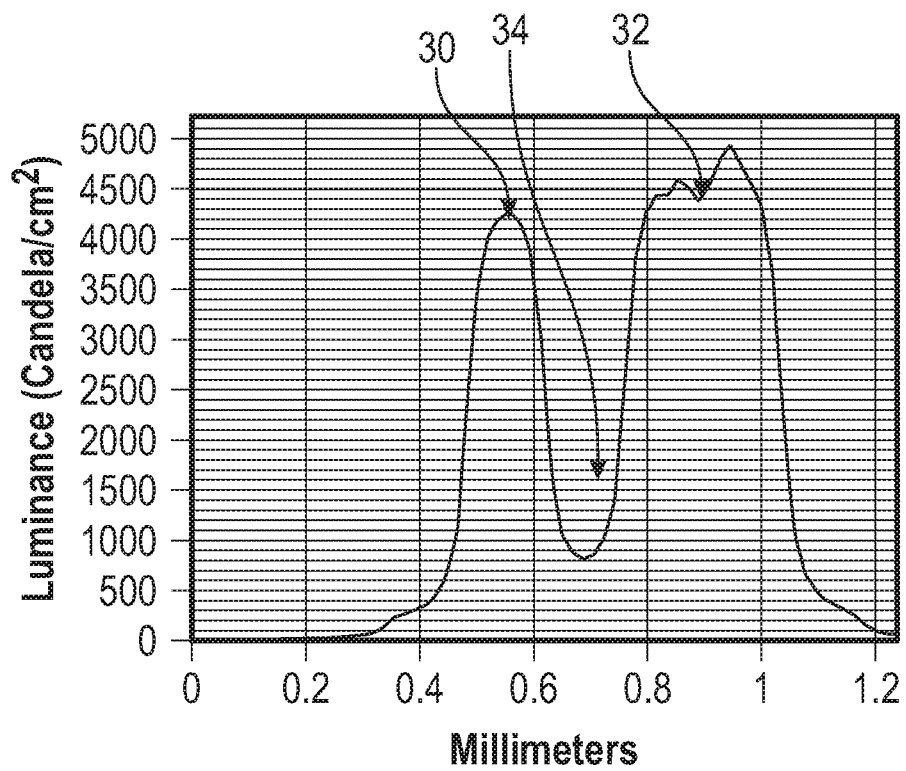
FIG. 2B is a line plot of an illumination profile when some of the LED chips of FIG. 2A are electrically activated, and some of the LED chips of FIG. 2A are electrically deactivated.

FIG. 2A is top view of an LED device 24 with a plurality of LED chips 26-1 to 26-6 arranged on a submount 28 as previously described. FIG. 2B is a line plot of an illumination profile when the LED chips 26-2, 26-4, and 26-5 are electrically activated, and the LED chips 26-1, 26-3, and 26-6 are electrically deactivated. The y-axis of the plot is luminance in candela per square centimeter (cd/cm$^2$) and the x-axis is the relative distance in millimeters (mm) a sensor moves across the plurality of LED chips 26-1 to 26-6 in a direction as indicated by the dashed line 29 of FIG. 2A. In the plot of FIG. 2B, a first high luminance area 30 indicates the relative position of the LED chip 26-2, and a second broader high luminance area 32 indicates the relative position of the LED chips 26-4, 26-5. A luminance valley 34 is located between the high luminance areas 30 and 32 and indicates the relative position of the LED chip 26-3. As shown in the plot, even though the LED chip 26-3 is electrically deactivated, an elevated luminance is measured due to lateral emissions and cross-talk from the LED chips 26-2, 26-4, and 26-5. In this regard, contrast between the electrically activated LED chips 26-2, 26-4, 26-5 and the electrically de-activated LED chips 26-1, 26-3, and 26-6 is lower that what is desired for certain applications.

In certain embodiments, a light-emitting device includes at least two LED chips that are laterally separated on a submount. A separate wavelength conversion element may be registered with each LED chip. To improve contrast between adjacent LED chips, a light-altering material may be arranged between the adjacent LED chips. The light-altering material may be adapted for dispensing, or placing, and may include many different materials including light-reflective materials that reflect or redirect light, light-absorbing materials that absorb light, and materials that act as a thixotropic agent. As used herein, the term "light-reflective" refers to materials or particles that reflect, refract, or otherwise redirect light. For light-reflective materials, the light-altering material may include at least one of fused silica, fumed silica, titanium dioxide ($TiO_2$), or metal particles suspended in a binder, such as silicone or epoxy. Particles of TiO$_2$ are generally more light-refracting while metal particles are generally more light-reflecting. In certain embodiments, metal particles may include Al particles, silver (Ag) particles, or combinations thereof. Al and Ag particles may have a nominal particle size of about 500 nm, or in a range including about 300 nm. The metal particles may comprise spherical powder, although other shapes including irregular shapes are possible. In certain embodiments, the light-reflecting materials comprise a generally white color. For light-absorbing materials, the light-altering material may include at least one of carbon, silicon, or metal particles suspended in a binder, such as silicon or epoxy. In certain embodiments, the light-absorbing materials comprise a generally black color. The light-reflective materials and the light-absorbing materials may comprise nanoparticles. In certain embodiments, the light-altering material includes both light-reflective materials and light-absorbing material suspended in a binder. A weight ratio of the light-reflective material to the binder may comprise a range of about 1:1 to about 2:1. A weight ratio of the light-absorbing material to the binder may comprise a range of about 1:400 to about 1:10. In certain embodiments, a total weight of the light-altering material includes any combination of the binder, the light-reflective material, and the light-absorbing material. In some embodiments, the binder may comprise a weight percent that is in a range of about 10% to about 90% of the total weight of the light-altering material; the light-reflective material may comprise a weight percent that is in a range of about 10% to about 90% of the total weight of the light-altering material; and the light-absorbing material may comprise a weight percent that is in a range of about 0% to about 15% of the total weight of the light-altering material. In further embodiments, the light-absorbing material may comprise a weight percent that is in a range of about greater than 0% to about 15% of the total weight of the light-altering material. In further embodiments, the binder may comprise a weight percent that is in a range of about 25% to about 70% of the total weight of the light-altering material; the light-reflective material may comprise a weight percent that is in a range of about 25% to about 70% of the total weight of the light-altering material; and the light-absorbing material may comprise a weight percent that is in a range of about 0% to about 5% of the total weight of the light-altering material. In further embodiments, the light-absorbing material may comprise a weight percent that is in a range of about greater than 0% to about 5% of the total weight of the light-altering material. In certain embodiments, the light-altering material may comprise a generally white color to reflect and redirect light. In other embodiments, the light-altering material may comprise a generally opaque or black color for absorbing light and increasing contrast of an LED package. The light-altering material can be dispensed or deposited in place using an automated dispensing machine where any suitable size and/or shape can be formed. The light-altering material may have a viscosity configured to be dispensed around a perimeter of an LED chip and surface tension will keep the light-altering material off of a primary emitting surface of the LED chip. Additionally, the light-altering material may wick in between adjacent LED chips that are separated by narrow lateral distances.

Figure 3A:
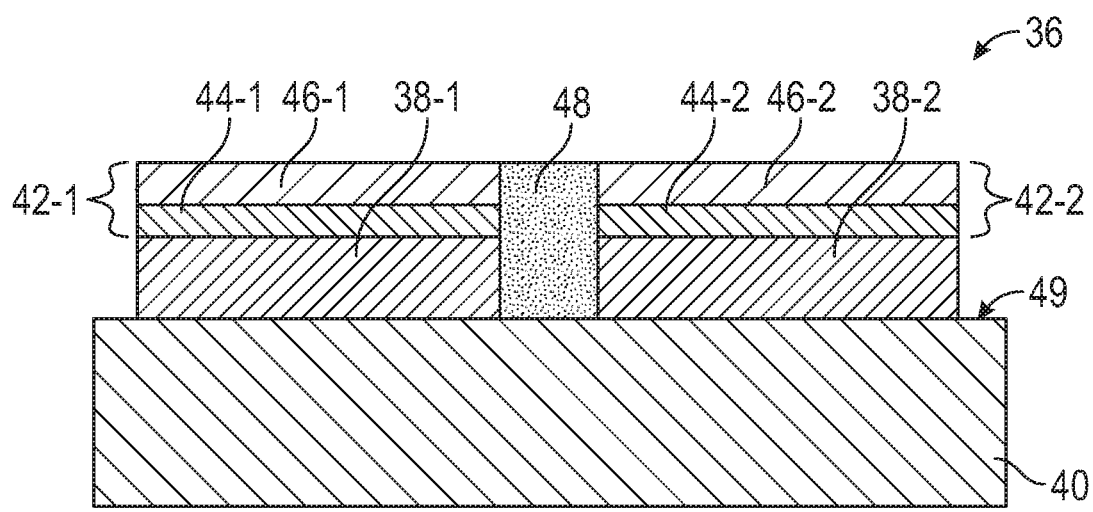
FIG. 3A is a side cross-sectional view of an LED device with a plurality of LED chips arranged on a submount according to embodiments disclosed herein.

FIG. 3A is a side cross-sectional view of an LED device 36 with a plurality of LED chips 38-1 to 38-2 arranged on a submount 40 according to embodiments disclosed herein. A first wavelength conversion element 42-1 that includes a first lumiphoric material 44-1 and a first superstrate 46-1 is registered with the first LED chip 38-1. A second wavelength conversion element 42-2 that includes a second lumiphoric material 44-2 and a second superstrate 46-2 is registered with the second LED chip 38-2. A light-altering material 48 is arranged between the first LED chip 38-1 and the second LED chip 38-2 on the submount 40. In certain embodiments, the light-altering material 48 extends from a first surface 49 of the submount 40 to a height that is at least level with the LED chips 38-1, 38-2. In further embodiments, the light-altering material 48 extends from the first surface 49 to a height that is at least level with the lumiphoric materials 44-1, 44-2. In still further embodiments, the light-altering material 48 extends from the first surface 49 to a height that is at least level with the wavelength conversion elements 42-1, 42-2. In certain embodiments, the light-altering material 48 includes light-reflective particles and light-absorbing particles that are interspersed and suspended in a same binder.

Figure 3B:
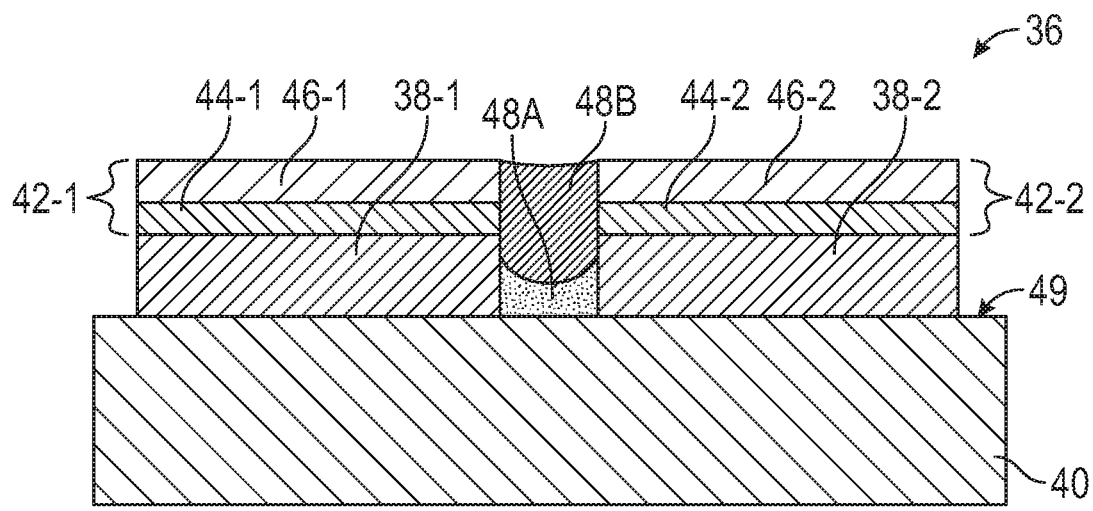
FIG. 3B is a side cross-sectional view of an LED device with a plurality of LED chips arranged on a submount according to embodiments disclosed herein.

FIG. 3B is a side cross-sectional view of an additional embodiment of the LED device 36 of FIG. 3A. As previously described, the plurality of LED chips 38-1 to 38-2 are arranged on the submount 40, the first wavelength conversion element 42-1 that includes the first lumiphoric material 44-1 and the first superstrate 46-1 is registered with the first LED chip 38-1, and the second wavelength conversion element 42-2 that includes the second lumiphoric material 44-2 and the second superstrate 46-2 is registered with the second LED chip 38-2. In FIG. 3B, a first light-altering material 48A and a second light-altering material 48B are arranged between the first LED chip 38-1 and the second LED chip 38-2 on the submount 40. In certain embodiments, a combination of the first and second light-altering materials 48A, 48B extends from the first surface 49 of the submount 40 to a height that is at least level with the LED chips 38-1, 38-2. In further embodiments, the combination of the first and second light-altering materials 48A, 48B extends from the first surface 49 to a height that is at least level with the lumiphoric materials 44-1, 44-2. In still further embodiments, the combination of the first and second light-altering materials 48A, 48B extends from the first surface 49 to a height that is at least level with the wavelength conversion elements 42-1, 42-2. The first and second light-altering materials 48A, 48B may be formed separately from one another by sequential dispensing or other deposition steps.

In certain embodiments, the first and second light-altering materials 48A, 48B includes light-reflective particles and light-absorbing particles that are interspersed and suspended in a same binder. In certain embodiments, the first light-altering material 48A comprises a different amount of light-reflective particles and/or light-absorbing particles than the second light-altering material 48B. For example, the first light-altering material 48A may comprise a lower amount of light-absorbing particles than the second light-altering material 48B. In certain embodiments, the first light-altering material 48A comprises no light-absorbing materials. In certain embodiments, the second light-altering material 48B may comprise at least two times the amount of light-absorbing particles as the first light-altering material 48A. In further embodiments, the second light-altering material 48B may comprise at least five times, or in a range of five times to ten times or more the amount of light-absorbing particles as the first light-altering material 48A. In this regard, the first light-altering material 48A is configured to reflect more light between the first LED chip 38-1 and the second LED chip 38-2 while the second light-altering material 48B is configured to provide more contrast between the first wavelength conversion element 42-1 and the second wavelength conversion element 42-2. Depending on the application, the order may be reversed in other embodiments such that the second light-altering material 48B comprises a lower amount of light-absorbing particles than the first light-altering material 48A. The amounts may differ in a similar manner as previously described. In this regard, the first light-altering material 48A may provide higher contrast between the first LED chip 38-1 and the second LED chip 38-2 while the second light-altering material 48B provides higher reflectivity between the first wavelength conversion element 42-1 and the second wavelength conversion element 42-2. In other embodiments, only one of the first light-altering material 48A and the second light altering material 48B comprises light-reflective and/or light absorbing particles while the other is substantially clear.

Figure 3C:
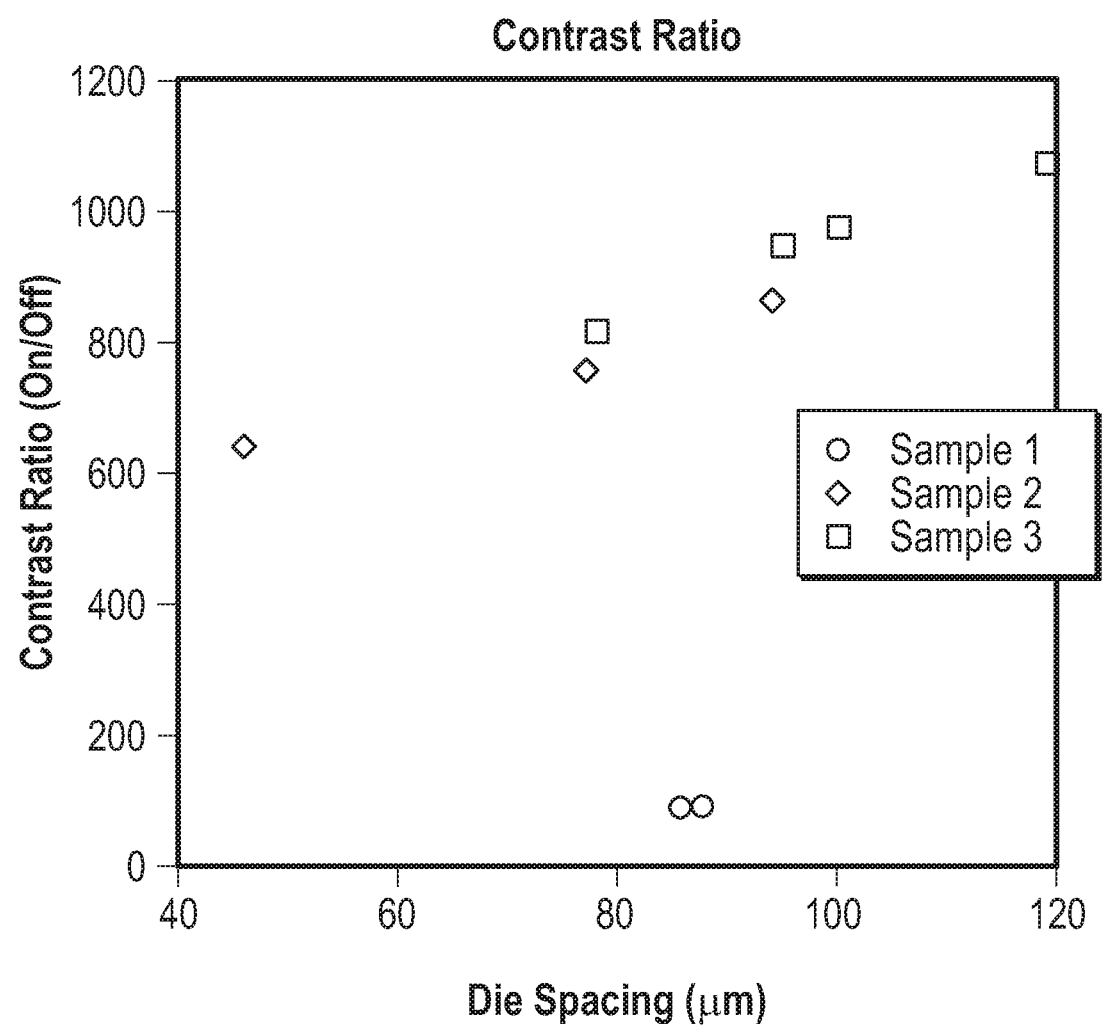
FIG. 3C is a plot representing contrast measurements for several configurations of the LED device of FIG. 3A.

FIG. 3C is a plot representing contrast measurements for several configurations of the LED device 36 of FIG. 3A. In a first configuration, labeled "Sample 1" in FIG. 3C, the light-altering material 48 of FIG. 3A includes a weight ratio of $TiO_2$ (light-reflective particles) to a silicone binder of about 1:1. In a second configuration, labeled "Sample 2" in FIG. 3C, the light-altering material 48 of FIG. 3A includes the same composition as Sample 1 with an addition of carbon particles (light-absorbing particles) in a weight ratio of about 1:25 of the binder. In a third configuration, labeled "Sample 3" in FIG. 3C, the light-altering material 48 of FIG. 3A includes the same composition as Sample 1 with an addition of carbon particles (light-absorbing particles) in a weight ratio of about 1:12.5 of the binder. For each of the Samples 1, 2, and 3, the light-reflective particles and the light-absorbing particles (only Samples 2 and 3) are interspersed and suspended in the same binder of silicone. The y-axis in FIG. 3C represents arbitrary units of a contrast ratio as defined by a ratio of luminance between an electrically activated LED chip (on) and an adjacent LED chip that is electrically deactivated (off). A higher contrast ratio indicates a higher delta between the measured luminance of the electrically activated LED chip compared to the electrically deactivated LED chip. The x-axis represents various configurations for the LED chip (or die) spacing for each of the samples in microns (μm). As shown by the plot, the configurations of Sample 2 and Sample 3 demonstrated notably higher contrast ratios for all LED chip spacings.

Figure 4:
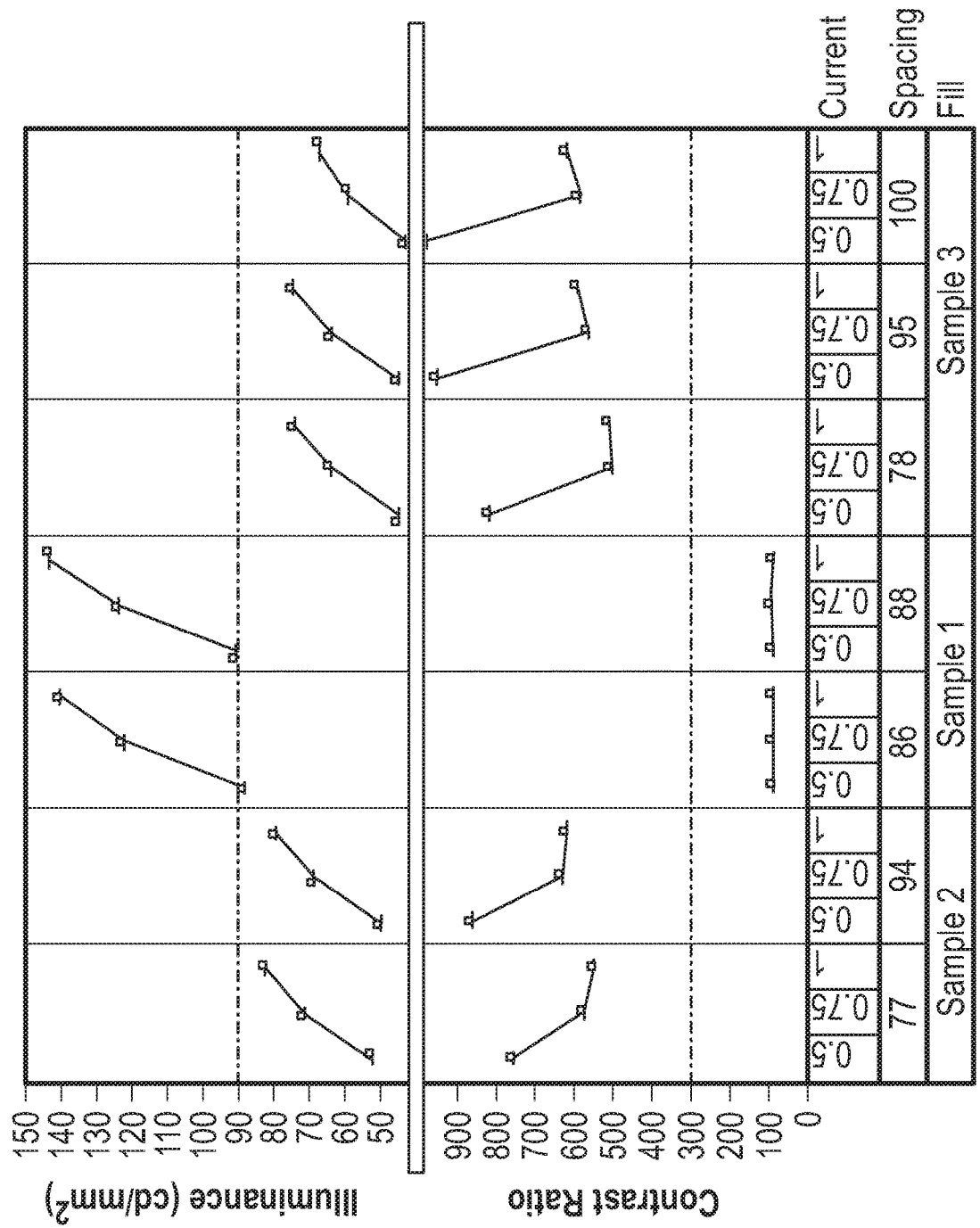
FIG. 4 is a plot representing illuminance and contrast ratio measurements of the configurations of FIG. 3C at various drive currents.

The addition of light-absorbing particles between LED chips can lead to a nominal decrease in brightness. However, this can be compensated for by increasing a drive current to the LED chips. FIG. 4 is a plot representing illuminance and contrast ratio measurements of the Samples 1, 2, and 3 of FIG. 3C at various drive currents. The x-axis represents the die spacing (in μm) and drive current (in amps) for each of the samples. The y-axis represents both illuminance in candela per square millimeter ($cd/mm^2$) and the contrast ratio. As expected, the illuminance values are lower for the Samples 2 and 3 that include light-absorbing particles. However, the drive current for the Samples 2 and 3 may be increased to increase the illuminance values and the contrast ratios remain notable higher than Sample 1 that does not include light-absorbing particles.

In certain embodiments, different configurations of light-reflective materials and light-absorbing materials may be provided. For example, a light-altering material that includes a first light-reflective material may be provided between two LED chips and a gap may be formed that extends through the light-altering material to a submount on which the LED chips are mounted. In certain embodiments, a second light-reflective material may be provided in the gap. In certain embodiments, a light-absorbing material may be provided in the gap. In still further embodiments, both of the second light-reflective material and the light-absorbing material may be provided in the gap. In this manner, further improvements to the illuminance and contrast ratio of adjacent LED chips may be realized.

Figure 5:
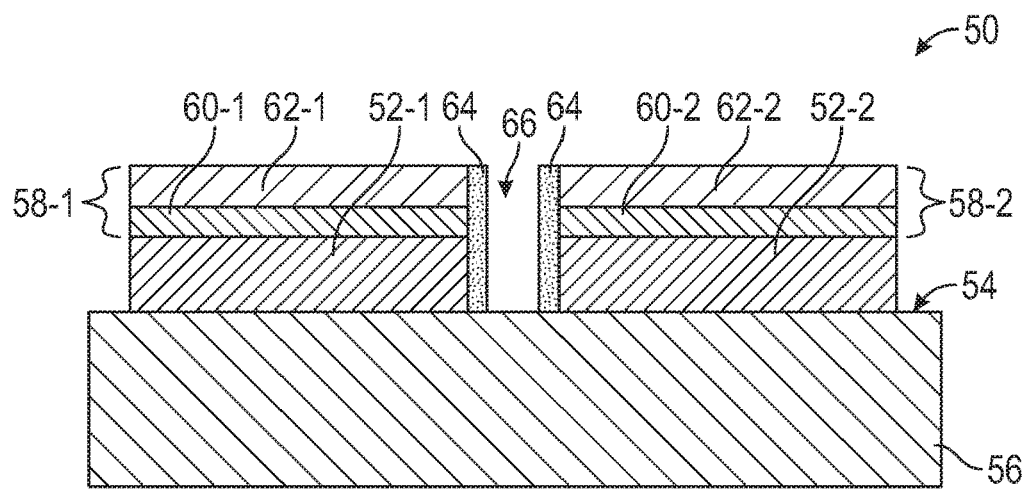
FIG. 5 is a side cross-sectional view of an LED device with a plurality of LED chips arranged on a first surface of a submount according to embodiments disclosed herein.

FIG. 5 is a side cross-sectional view of an LED device 50 with a plurality of LED chips 52-1 to 52-2 arranged on a first surface 54 of a submount 56 according to embodiments disclosed herein. The LED device 50 additionally includes: a first wavelength conversion element 58-1 with a first lumiphoric material 60-1 and a first superstrate 62-1; a second wavelength conversion element 58-2 with a second lumiphoric material 60-2 and a second superstrate 62-2; and a light-altering material 64 as previously described. In FIG. 5, a portion of the light-altering material 64 is removed or never deposited to form a gap 66 in the light-altering material 64 between a first LED chip 52-1 and a second LED chip 52-2. In certain embodiments, the gap 66 extends through the light-altering material 64 to the first surface 54 of the submount 56. The gap 66 may provide an index of refraction delta with the light-altering material 64. In this manner, light traveling laterally between the LED chips 52-1, 52-2 and the wavelength conversion elements 58-1, 58-2 may be redirected in a desired direction, thereby improving overall illuminance levels and contrast between the LED chips 52-1, 52-2.

Figure 6:
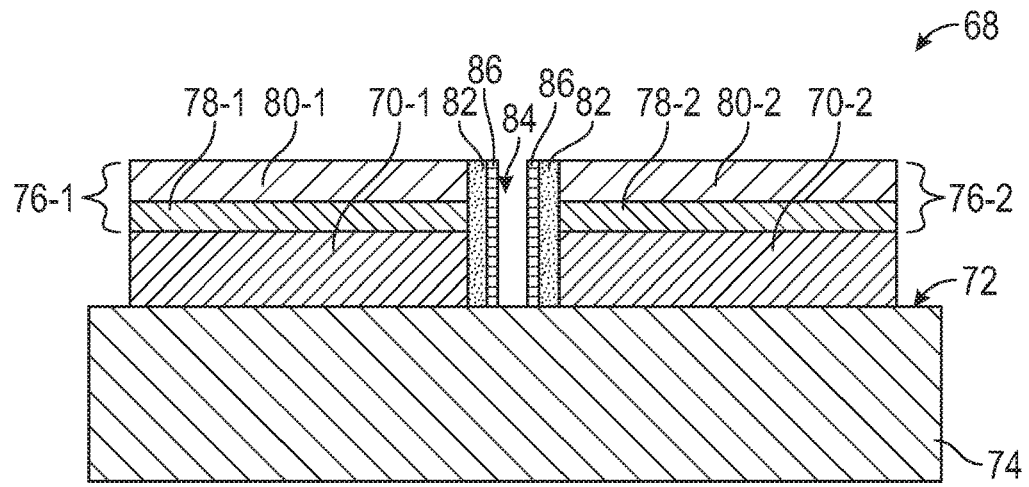
FIG. 6 is a side cross-sectional view of an LED device with a plurality of LED chips arranged on a first surface of a submount according to embodiments disclosed herein.

FIG. 6 is a side cross-sectional view of an LED device 68 with a plurality of LED chips 70-1 to 70-2 arranged on a first surface 72 of a submount 74 according to embodiments disclosed herein. The LED device 68 additionally includes: a first wavelength conversion element 76-1 with a first lumiphoric material 78-1 and a first superstrate 80-1; a second wavelength conversion element 76-2 with a second lumiphoric material 78-2 and a second superstrate 80-2; a first light-altering material 82; and a gap 84 as previously described. In FIG. 6, a second light-altering material 86 is formed on the first light-altering material 82. The second light-altering material 86 may be formed by selective thin film deposition, such as through a mask, in the gap 84. The second light-altering material 86 may include at least one of a light-reflective-material and/or a light-absorbing material as previously described. In certain embodiments, the second light-altering material 86 comprises a layer of reflective metal and the first light-altering material 82 comprises light-reflective particles. In other embodiments, the second light-altering material 86 comprises light-absorbing particles and the first light-altering material 82 comprises light-reflective particles. In other embodiments, the second light-altering material 86 comprises light-reflective particles and the first light-altering material 82 comprises light-absorbing particles. In still further embodiments, the first light-altering material 82 and the second light-altering material 84 may both include light-reflective particles and light-absorbing particles in differing amounts.

Figure 7:
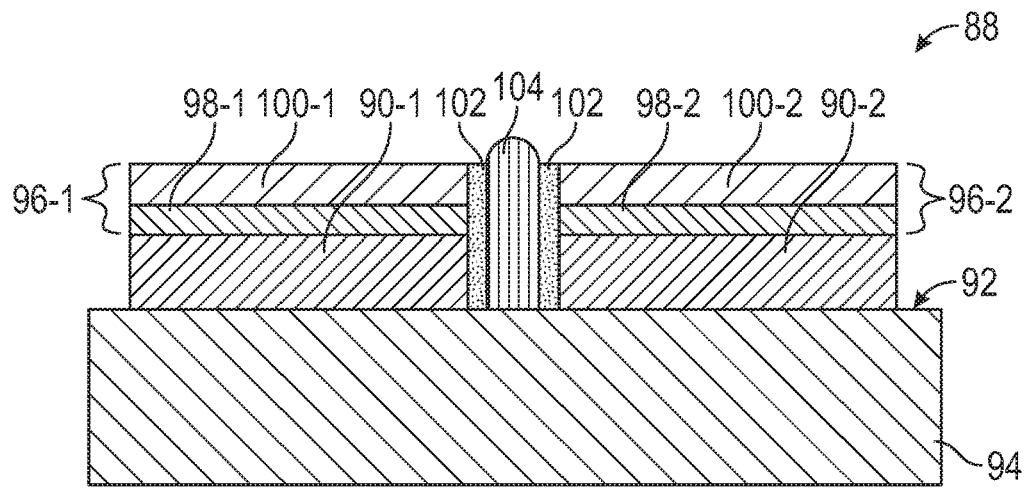
FIG. 7 is a side cross-sectional view of an LED device with a plurality of LED chips arranged on a first surface of a submount according to embodiments disclosed herein.

FIG. 7 is a side cross-sectional view of an LED device 88 with a plurality of LED chips 90-1 to 90-2 arranged on a first surface 92 of a submount 94 according to embodiments disclosed herein. The LED device 88 additionally includes: a first wavelength conversion element 96-1 with a first lumiphoric material 98-1 and a first superstrate 100-1; a second wavelength conversion element 96-2 with a second lumiphoric material 98-2 and a second superstrate 100-2; and a first light-altering material 102 as previously described. In FIG. 7, a second light-altering material 104 fills a gap (66 of FIG. 5) formed in the first light-altering material 102. The second light-altering material 104 may be formed by dispensing or depositing in the gap (66 of FIG. 5). The second light-altering material 104 may include at least one of a light-reflective-material and/or a light-absorbing material as previously described. In certain embodiments, the second light-altering material 104 comprises light-absorbing particles and the first light-altering material 102 comprises light-reflective particles. In other embodiments, the second light-altering material 104 comprises light-reflective particles and the first light-altering material 102 comprises light-absorbing particles. In still further embodiments, the first light-altering material 102 and the second light-altering material 104 may both include light-reflective particles and light-absorbing particles in differing amounts. In certain embodiments, the second light-altering material 104 extends above the first light-altering material 102 in a direction away from the first surface 92 of the submount 94. In this regard, more light traveling laterally may be redirected or absorbed between the LED chips 90-1, 90-2, thereby further improving contrast.

Figure 8:
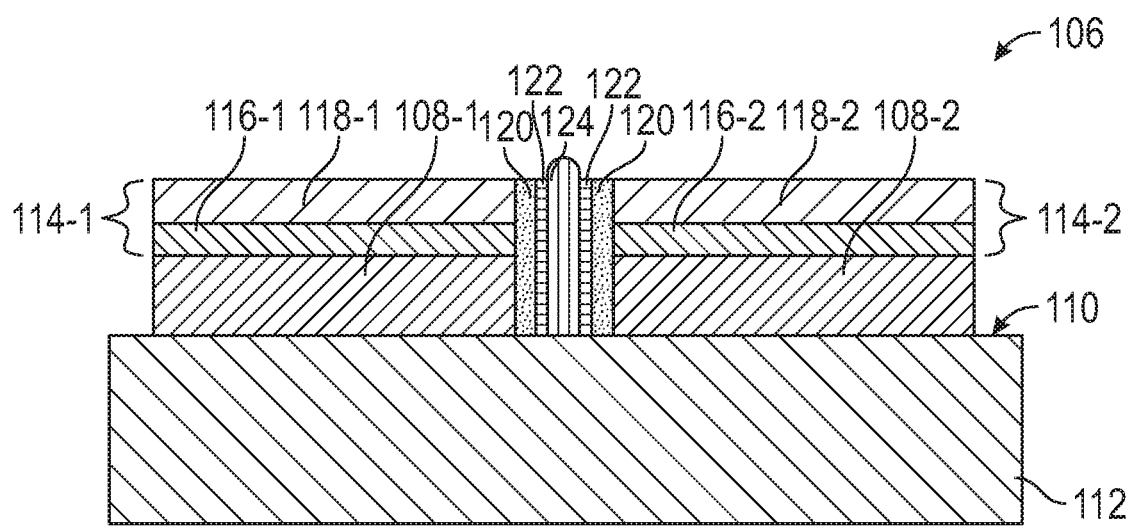
FIG. 8 is a side cross-sectional view of an LED device with a plurality of LED chips arranged on a first surface of a submount according to embodiments disclosed herein.

FIG. 8 is a side cross-sectional view of an LED device 106 with a plurality of LED chips 108-1 to 108-2 arranged on a first surface 110 of a submount 112 according to embodiments disclosed herein. The LED device 106 additionally includes: a first wavelength conversion element 114-1 with a first lumiphoric material 116-1 and a first superstrate 118-1; a second wavelength conversion element 114-2 with a second lumiphoric material 116-2 and a second superstrate 118-2; and a first light-altering material 120 as previously described. In FIG. 8, a second light-altering material 122 and a third light-altering material 124 fills a gap (66 of FIG. 5) formed in the first light-altering material 120. The second light-altering material 122 is similar to the second light-altering material 86 of FIG. 5, and the third light-altering material 124 is similar to the second light-altering material 104 of FIG. 7. In certain embodiments, the first light-altering material 120 includes light-reflective particles, the second light-altering material 122 includes a layer of reflective metal, and the third light-altering material 124 includes light-absorbing particles. In other embodiments, the first light-altering material 120 includes light-absorbing particles and the third light-altering material 124 includes light-reflective particles. In still other embodiments, the first light-altering material 120, the second light-altering material 122, and the third light-altering material 124 may all include both light-reflective particles and light-absorbing particles, but in differing amounts.

Embodiments as disclosed herein may be particularly suited for LED devices or packages that include a plurality of LED chips that form an LED array on a submount. Anode and cathode bond pads may be provided on the submount that are configured to receive an external electrical connection, such as wirebonds. Electrically conductive anode paths and electrically conductive cathode paths are configured to electrically connect the anode and cathode bond pads with the plurality of LED chips. In certain embodiments, the anode and cathode bond pads are on a same surface of the submount on which the plurality of LED chips are mounted. In other embodiments, the anode and cathode bond pads are on an opposite surface of the submount from the plurality of LED chips.

Figure 9:
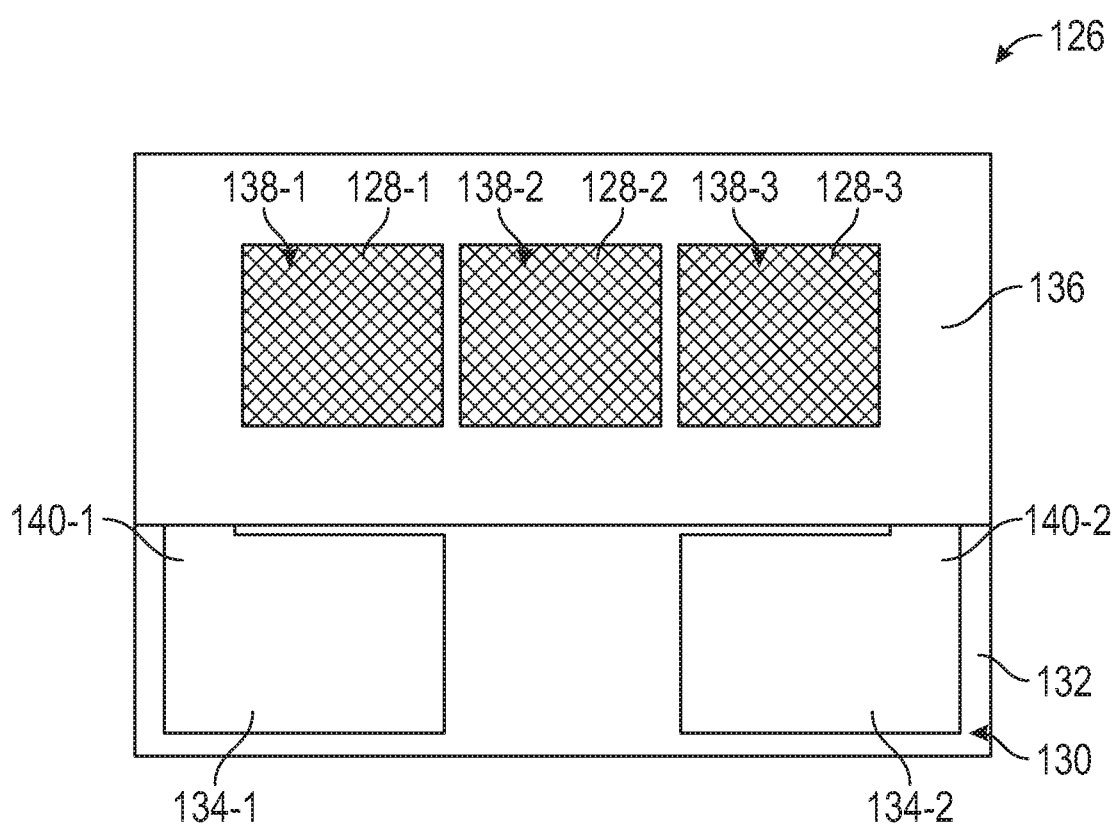
FIG. 9 is a top view of an LED package including a plurality of LED chips on a first surface of a submount according to embodiments disclosed herein.

FIG. 9 is a top view of an LED package 126 including a plurality of LED chips 128-1 to 128-3 on a first surface 130, or face, of a submount 132 according to embodiments disclosed herein. A first bond pad 134-1 and a second bond pad 134-2 are provided on the first surface 130 of the submount 132 and laterally spaced away from the plurality of LED chips 128-1 to 128-3 on the first surface 130. Depending on the configuration, the first bond pad 134-1 may comprise either a cathode bond pad or an anode bond pad and the second bond pad 134-2 may comprise the other of the cathode bond pad or the anode bond pad. A light-altering material 136 as previously described is arranged around an entire perimeter of a first LED chip 128-1, around an entire perimeter of a second LED chip 128-2, and around an entire perimeter of a third LED chip 128-3. In certain embodiments, individual wavelength conversion elements 138-1 to 138-3 are separately registered with each of the plurality of LED chips 128-1 to 128-3. The light-altering material 136 is additionally arranged around an entire perimeter of each of the wavelength conversion elements 138-1 to 138-3. In certain embodiments, at least a portion of the light-altering material 136 extends to a lateral edge of the first surface 130 of the submount 132. In FIG. 9, the light-altering material 136 extends to three of the four lateral edges of the submount 132. In this manner, the light-altering material 136 does not extend to the fourth lateral edge of the submount 132 that is adjacent the first bond pad 134-1 and the second bond pad 134-2. Accordingly, the first bond pad 134-1 and the second bond pad 134-2 are uncovered by the light-altering material 136. In certain embodiments, the light-altering material 136 is configured to redirect or reflect laterally-emitting light from the LED chips 128-1 to 128-3 or the wavelength conversion elements 138-1 to 138-3 toward a desired emission direction. In certain embodiments, the light-altering material 136 may block or absorb at least a portion of any laterally-emitting light from the LED chips 128-1 to 128-3 or the wavelength conversion elements 138-1 to 138-3. The light-altering material 136 may partially cover the submount 132 outside of where the LED chips 128-1 to 128-3 are located. In this regard, the light-altering material 136 may cover portions of the submount that extend from the first bond pad 134-1 and the second bond pad 134-2 to the LED chips 128-1 to 128-3, while leaving the first bond pad 134-1 and the second bond pad 134-2 uncovered. A first electrically conductive path 140-1 electrically connects the first bond pad 134-1 to at least one of the plurality of LED chips 128-1 to 128-3 and a second electrically conductive path 140-2 electrically connects the second bond pad 134-2 to at least one of the plurality of LED chips 128-1 to 128-3. In FIG. 9, the electrically conductive paths 140-1, 140-2 are on the first surface 130 of the submount 132 and barely visible outside of the light-altering material 136. In this regard, the electrically conductive paths 140-1, 140-2 comprise traces that extend on the first surface 130 under the light-altering material 136. In other embodiments, the light-altering material 136 entirely covers the electrically conductive paths 140-1, 140-2.

Figure 10A:
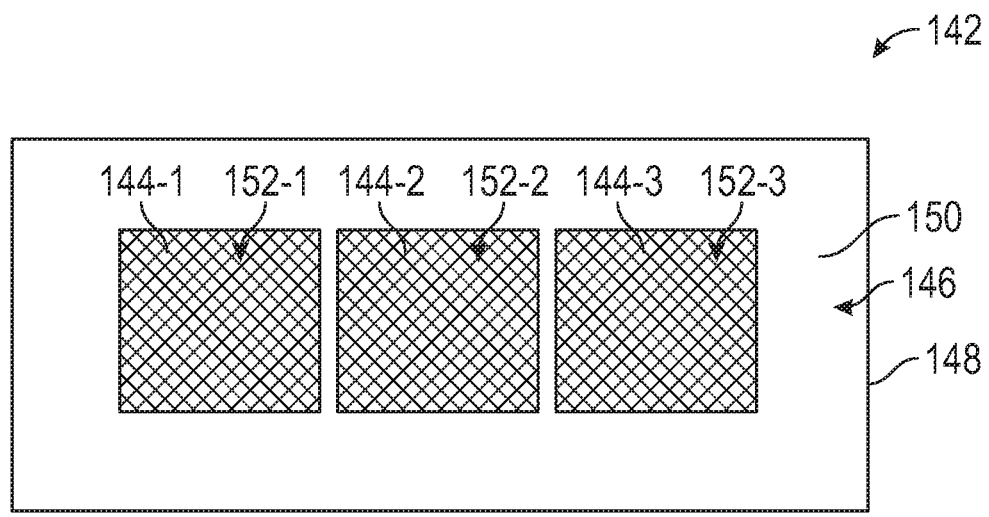
FIG. 10A is a top view of an LED package including a plurality of LED chips on a first surface of a submount according to embodiments disclosed herein.
Figure 10B:
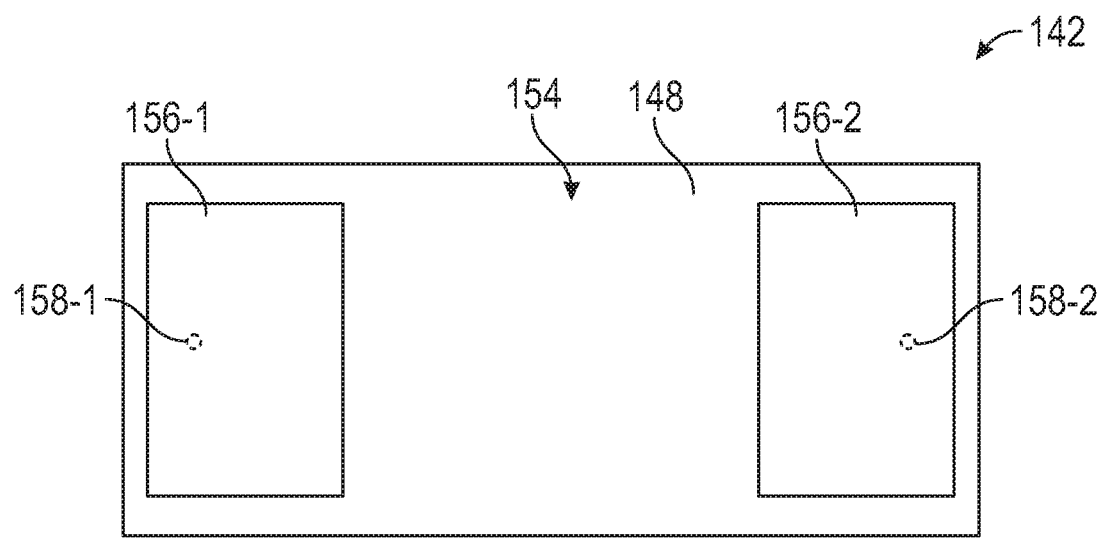
FIG. 10B is a bottom view of the LED package of FIG. 10A.

FIG. 10A is a top view of an LED package 142 including a plurality of LED chips 144-1 to 144-3 on a first surface 146 of a submount 148 according to embodiments disclosed herein. The LED package 142 may further include a light-altering material 150 and a plurality of wavelength conversion elements 152-1 to 152-3 as previously described. In FIG. 10A, the light-altering material 150 covers substantially all of the first surface 146 of the submount 148. In certain embodiments, at least a portion of the light-altering material 150 extends to all lateral edges of the first surface 146 of the submount 148. FIG. 10B is a bottom view of the LED package 142 of FIG. 10A. A second surface 154 of the submount 148 that opposes the first surface 146 of FIG. 10A is visible. A first bond pad 156-1 and a second bond pad 156-2 as previously described are arranged on the second surface 154 of the submount 148. In this manner, the LED package 142 may be configured to be surface mounted to a board (not shown) such that the bond pads 156-1, 156-2 align with electrical traces or pads on the board. As with the LED device 126 of FIG. 9, a first electrically conductive path 158-1 electrically connects the first bond pad 156-1 to at least one of the plurality of LED chips 152-1 to 152-3 (FIG. 10A), and a second electrically conductive path 158-2 electrically connects the second bond pad 156-2 to at least one of the plurality of LED chips 152-1 to 152-3 (FIG. 10A). However, in FIG. 10B, the electrically conductive paths 158-1, 158-2 extend from the second surface 154 of the submount 148 to the first surface 146. In that regard, the electrically conductive paths 158-1, 158-2 may comprise electrically conductive vias that extend through the submount 148.

As previously described, embodiments as disclosed herein may be particularly suited for LED devices or packages that include a plurality of LED chips that form an LED array on a submount. In certain embodiments, the LED chips of the LED array are individually controllable in a manner such that each of the LED chips may be independently turned on and off. Improved contrast ratios between on and off LED chips in the LED array may be desirable in applications where emission directions and patterns from a LED device are adjustable. Such applications include automotive lighting such as adaptable light sources for headlights, aerospace lighting, general illumination, video screen displays, and pixelated LED arrays. In order to provide an LED device with a plurality of independently controllable LED chips, a submount may include multiple anode and cathode bond pads with multiple electrically conductive anode and cathode paths. In certain embodiments, at least one of the electrically conductive anode and cathode paths is discontinuous along a first face of a submount where the LED chips are mounted. In this regard, a portion of the electrically conductive anode and cathode paths may extend along a second face of the submount that is opposite the first face. Embodiments as disclosed herein may describe particular configurations of anodes and cathodes, anode and cathode bond pads, and electrically conductive anode and cathode paths. It is understood that in other configurations the polarities may be reversed by renaming elements described with anode configurations as cathodes and vice versa.

Figure 11A:
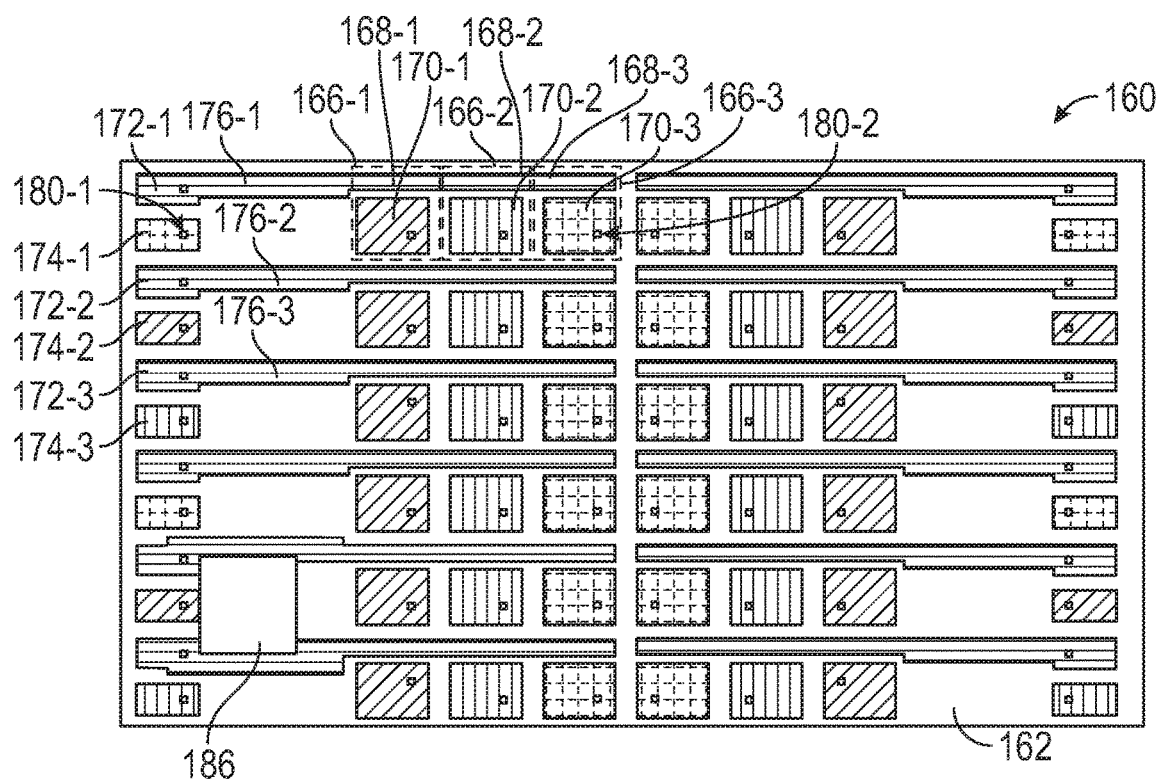
FIG. 11A is a top view of a submount configured for an individually controllable LED array according to embodiments disclosed herein.
Figure 11B:
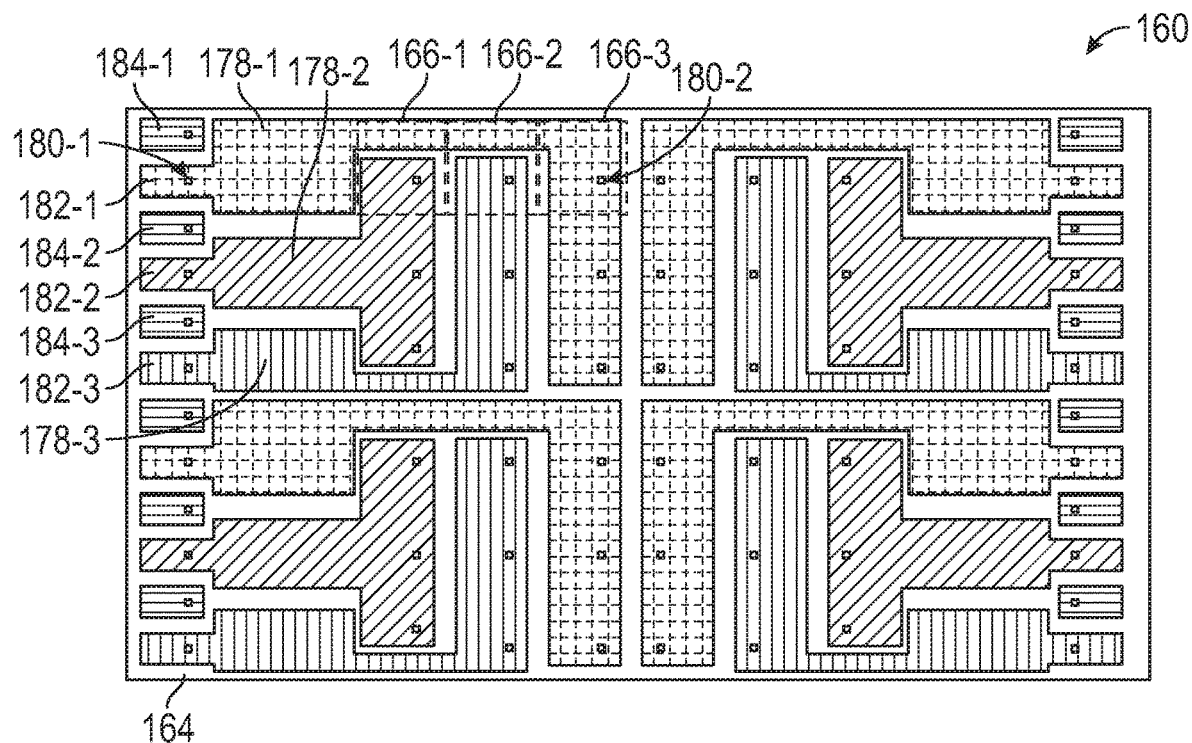
FIG. 11B is a bottom view of the submount of FIG. 11A.

FIG. 11A is a top view of a submount 160 configured for an individually controllable LED array according to embodiments disclosed herein. FIG. 11B is a bottom view of the submount 160 of FIG. 11A. The submount 160 comprises a first face 162 and a second face 164 that opposes the first face 162. A plurality of LED chip mounting regions 166-1 to 166-3 are on the first face as indicated by the dashed lines in FIG. 11A. For illustrative purposes, the location of the plurality of LED chip mounting regions 166-1 to 166-3 relative to the second face 164 are shown in dashed lines in FIG. 11B. For simplicity, only the LED chip mounting regions 166-1 to 166-3 are labeled. However, the submount 160 as illustrated is configured with LED chip mounting regions for thirty-six individual LED chips and the following description may be applicable to all of the LED chip mounting regions. Additionally, embodiments as disclosed herein are applicable to any number of LED chip mounting regions. A first LED chip mounting region 166-1 includes a first anode 168-1 and a first cathode 170-1; a second LED chip mounting region 166-2 includes a second anode 168-2 and a second cathode 170-2; a third LED chip mounting region 166-3 includes a third anode 168-3 and a third cathode 170-3; and so on. By way of an example, the first anode 168-1 and the first cathode 170-1 are configured to electrically contact a corresponding anode and cathode of an LED chip (not shown) that may be mounted in the first mounting region 166-1. A plurality of first anode bond pads 172-1 to 172-3 and a plurality of first cathode bond pads 174-1 to 174-3 are arranged on the first face 162 of the submount 160. For simplicity in FIG. 11A, only the first anode bond pads 172-1 to 172-3 and the first cathode bond pads 174-1 to 174-3 are labeled. In order to individually control each of the LED chips that will be mounted in the plurality of LED chip mounting regions 166-1 to 166-3, each LED chip mounting region 166-1 to 166-3 is electrically connected with a unique pair of one of the first anode bond pads 172-1 to 172-3 and one of the first cathode bond pads 174-1 to 174-3. A plurality of electrically conductive anode paths 176-1 to 176-3 and a plurality of electrically conductive cathode paths 178-1 to 178-3 are used to make these connections. For example, the electrically conductive anode path 176-1 extends between and is continuous with the first anode 168-1 and the first anode bond pad 172-1; and the electrically conductive cathode path 178-2 (FIG. 11B) extends between and is continuous with the first cathode 170-1 and the second cathode bond pad 174-2. In this manner, electrical connections with the first anode bond pad 172-1 and the second cathode bond pad 174-2 may be used to electrically control an LED chip mounted to the first LED chip mounting region 166-1. In a similar manner, electrical connections with the first anode bond pad 172-1 and the first cathode bond pad 174-1 may be used to electrically control an LED chip mounted to the third LED chip mounting region 166-3. Accordingly, the third LED chip mounting region 166-3 shares the electrically conductive anode path 176-1 and the first anode bond pad 172-1 with the first LED chip mounting region 166-1. However, the third LED chip mounting region 166-3 is electrically connected with the first cathode bond pad 174-1 by way of the electrically conductive cathode path 178-1.

As illustrated in FIGS. 11A and 11B, the plurality of electrically conductive cathode paths 178-1 to 178-3 are discontinuous on the first face 162 of the submount 160. In this manner, the plurality of electrically conductive cathode paths 178-1 to 178-3 extend through the submount 160 to the second face 164 of the submount, and at least a portion of the plurality of electrically conductive cathode paths 178-1 to 178-3 extend on the second face 164. By way of example, the electrically conductive cathode path 178-1 includes a first electrically conductive via 180-1 that extends from the first cathode bond pad 174-1 on the first face 162 to a second cathode bond pad 182-1 on the second face 164. A portion of the electrically conductive cathode path 178-1 extends along the second face 164 to an area below the third LED chip mounting region 166-3. The electrically conductive cathode path 178-1 further includes a second via 180-2 that extends to the third cathode 170-3 on the first face 162. In this manner, each one of the plurality of first anode bond pads 172-1 to 172-3 is electrically connected to a corresponding one of a plurality of second anode bond pads 184-1 to 184-3 through the submount 160 by vias, and each one of the plurality of first cathode bond pads 174-1 to 174-3 has a corresponding one of the plurality of second cathode bond pad 182-1 to 182-3 that are also electrically connected through the submount 160 by vias. Accordingly, the submount 160 is configured to receive external electrical connections on either of the first face 162 (e.g. by wire bonds) or the second face 164 (e.g. by corresponding electrical traces on a board).

As illustrated in FIGS. 11A and 11B, each of the plurality of electrically conductive anode paths 176-1 to 176-3 and each of the plurality of electrically conductive cathode paths 178-1 to 178-3 are configured to be electrically connected with more than one of the plurality of LED chip mounting regions 166-1 to 166-3. However, in certain embodiments, each LED chip mounting region 166-1 to 166-3 comprises a unique combination of a particular electrically conductive anode path 176-1 to 176-3 and a particular electrically conductive cathode path 178-1 to 178-3. By sharing electrically conductive anode or cathode paths to control different LED chips, a total number of electrically conductive anode or cathode paths may be reduced while still maintaining independent control of each LED chip that is mounted on the submount 160. In certain embodiments, the total number of electrically conductive anode and cathode paths may be less than a total number of LED chips. For example, FIGS. 11A and 11B illustrate a submount configured with thirty-six different LED chip mounting areas that are configured to receive and independently control thirty-six LED chips with only twelve electrically conductive anode paths and only twelve electrically conductive cathode paths. By having a reduced number of electrically conductive anode or cathode paths, electrical connections on the submount may be simplified. Accordingly, the first surface 162 of the submount 160 may have space for an area 186 that includes identification or other information, including a quick response (QR) code, a bar code, or alphanumeric information.

In certain embodiments, the portions of the electrically conductive cathode paths 178-1 to 178-3 on the second face 164 include expanded dimensions. In this manner, an increased surface area of the second face 164 is covered by the electrically conductive cathode paths 178-1 to 178-3. In certain embodiments, the electrically conductive cathode paths 178-1 to 178-3 include one or more layers of metal or metal alloys that comprise good thermal conductivity. In this regard, the portions of the electrically conductive cathode paths 178-1 to 178-3 on the second face 164 may additionally serve as heat sinks or heat spreaders to assist with heat dissipation away from LED chips mounted on the first face 162. In certain embodiments, between about 60% and 95% of the total surface area of the second face 164 is covered by the electrically conductive cathode paths 178-1 to 178-3. In further embodiments, between about 70% and 80% of the total surface area of the second face 164 is covered by the electrically conductive cathode paths 178-1 to 178-3. In still further embodiments, between about 70% and 75% of the total surface area of the second face 164 is covered by the electrically conductive cathode paths 178-1 to 178-3.

In certain embodiments, a plurality of LED chips of an LED array may be mounted on a submount. Each LED chip of the plurality of LED chips is laterally separated from at least one other LED chip of the plurality of LED chips by a first distance, and at least one LED chip of the plurality of LED chips is laterally separated from a first lateral edge of the submount by a second distance that is in a range of about 40% to about 60%, or about 45% to 55%, or about 50% of the first distance. In this regard, multiple submounts may be positioned adjacent to each other, and LED chips on the multiple submounts form an LED array where the first distance is maintained across the multiple submounts within the LED array. In certain embodiments, the second distance is in a range of about 20 μm to about 120 μm. In further embodiments, the second distance is in a range of about 40 μm to about 100 μm. In still further embodiments, the second distance is in a range 50 μm to about 90 μm. Other dimensions for the second distance are possible provided the dimensions are close enough that when multiple submounts are positioned adjacent to one another, the lateral separation of LED chips across the multiple submounts appears uniform. Additionally, a plurality of anode bond pads and a plurality of cathode bond pads may be arranged along one or more lateral edges of a submount. When multiple submounts are arranged together, the plurality of anode and cathode bond pads may be arranged on one or more lateral edges of the submounts that are different from lateral edges where the submounts are joined together.

Figure 12:
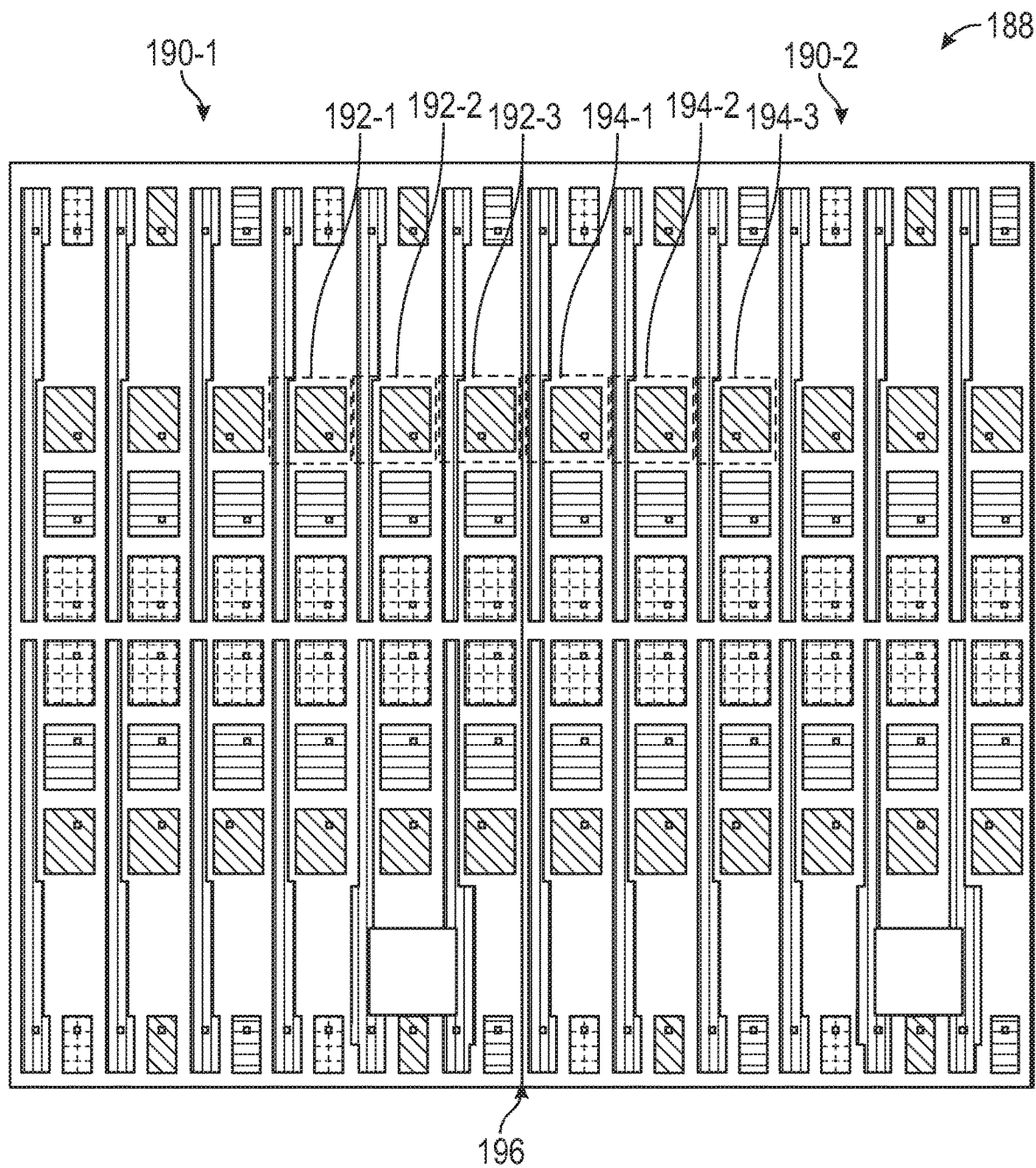
FIG. 12 is top view of an LED device that includes a first submount and a second submount that are positioned adjacent to one another.

FIG. 12 is top view of an LED device 188 that includes a first submount 190-1 and a second submount 190-2 that are positioned adjacent to one another. The first submount 190-1 and the second submount 190-2 are similar to the submount 160 of FIGS. 11A and 11B. The first submount 190-1 includes a plurality of first LED chip mounting areas 192-1 to 192-3 and the second submount 190-2 includes a plurality of second LED chip mounting areas 194-1 to 194-3. As before, only some of the first LED chip mounting areas 192-1 to 192-3 and only some of the second LED chip mounting areas 194-1 to 194-3 are numbered for simplicity. Each of the first LED chip mounting areas 192-1 to 192-3 are laterally separated from at least one other of the first LED chip mounting areas 192-1 to 192-3 by a first distance, and at least one of the first LED chip mounting areas 192-1 to 192-3 is laterally separated from a first lateral edge 196 of the first submount 190-1 by a second distance that is about half of the first distance. In particular embodiments, the second distance is in a range of about 40% to about 60%, or about 45% to 55%, or about 50% of the first distance. Other dimensions for the second distance are possible provided the dimensions are close enough that when the submounts 190-1, 190-2 are positioned adjacent to one another, the lateral separation of subsequently-mounted LED chips across the submounts 190-1, 190-2 appears uniform. In a similar manner, each of the second LED chip mounting areas 194-1 to 194-3 are laterally separated by the same first distance, and at least one of the second LED chip mounting areas 194-1 to 194-3 is separated from the first lateral edge by the same second distance. In this regard, when the first submount 190-1 and the second submount 190-2 are aligned at the lateral edge 196, the first distance is maintained between the first LED chip mounting areas 192-1 to 192-3 and the second LED chip mounting areas 194-1 to 194-3 that are closest to the lateral edge 196. In certain embodiments, the first distance may include a range of about 0.04 mm to about 1 mm. In further embodiments, the first distance may include a range of about 0.04 mm to about 0.5 mm, or a range of about 0.04 mm to about 0.2 mm, or a range of about 0.04 to about 0.12 mm. In certain embodiments, LED chips to be mounted on the submounts 190-1, 190-2 comprise a longest dimension of about 0.7 mm and the first distance is in a range of about 0.05 mm to about 0.1 mm.

Figures 13A, 13B:
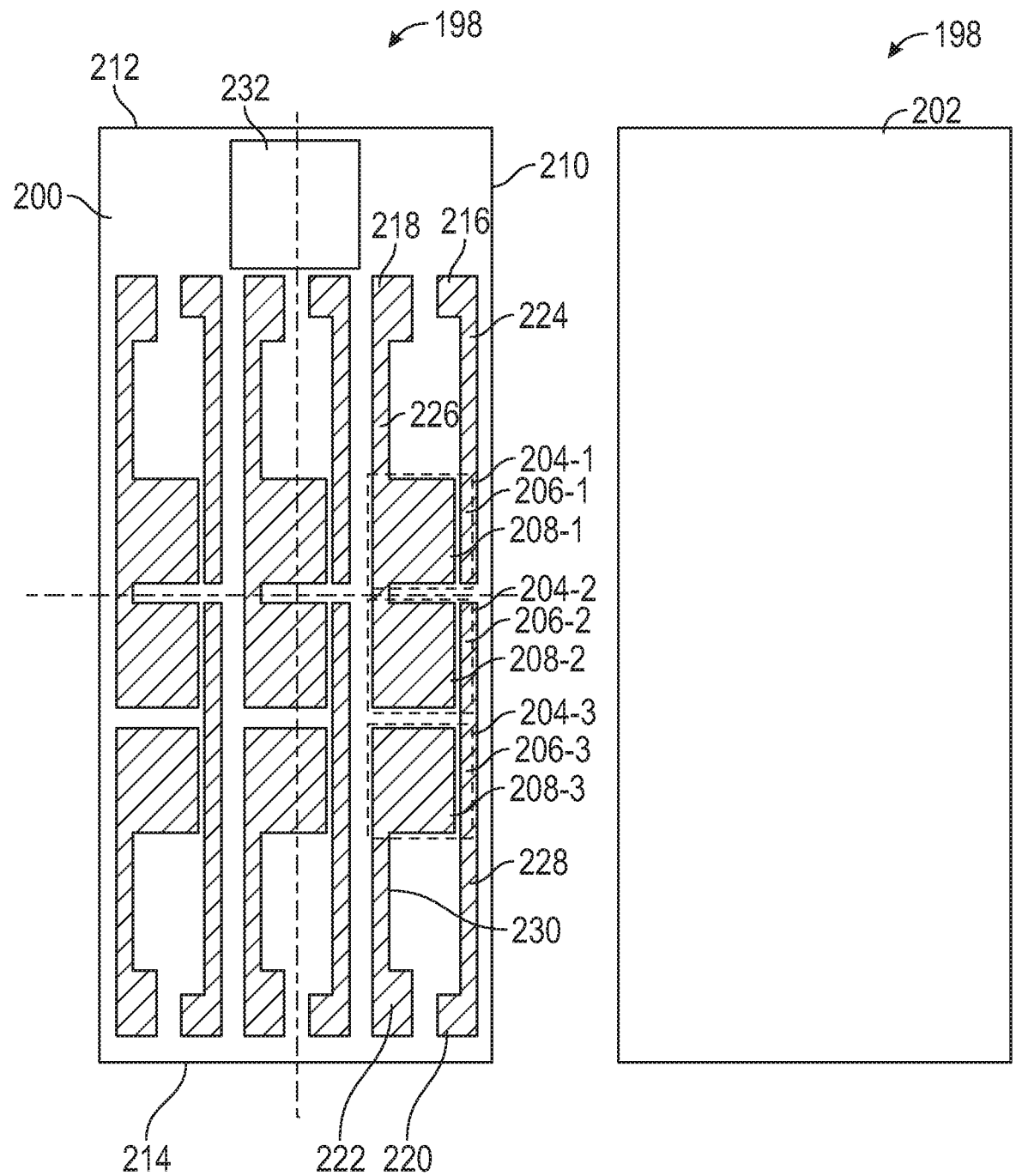
FIG. 13A is a top view of a submount configured for an individually controllable LED array according to embodiments disclosed herein.
FIG. 13B is a bottom view of the submount of FIG. 13A.

FIG. 13A is a top view of a submount 198 configured for an individually controllable LED array according to embodiments disclosed herein. FIG. 13B is a bottom view of the submount 198 of FIG. 13A. The submount 198 comprises a first face 200 and a second face 202 that opposes the first face 200. A plurality of LED chip mounting regions 204-1 to 204-3 are on the first face 200 as indicated by the dashed lines in FIG. 13A. As illustrated, the submount 198 is configured with nine LED chip mounting regions, however only the LED chip mounting regions 204-1 to 204-3 are labeled. A first LED chip mounting region 204-1 includes a first anode 206-1 and a first cathode 208-1; a second LED chip mounting region 204-3 includes a second anode 206-2 and a second cathode 208-2; a third LED chip mounting region 204-3 includes a third anode 206-3 and a third cathode 208-3; and so on. By way of an example, the first anode 206-1 and the first cathode 208-1 are configured to electrically contact a corresponding anode and cathode of an LED chip (not shown) that may be mounted in the first mounting region 204-1. In certain embodiments, the LED chip mounting regions 204-1 to 204-3 are aligned along a first lateral edge 210 of the submount 198 with a spacing as previously described. The submount 198 additionally includes a second lateral edge 212 and a third lateral edge 214 that are both adjacent the first lateral edge 210. In certain embodiments, the second lateral edge 212 and the third lateral edge 214 each are substantially perpendicular with the first lateral edge 210 on opposing sides of the submount 198.

A first anode bond pad 216 and a first cathode bond pad 218 are both arranged on the first face 200 along the second lateral edge 212, and a second anode bond pad 220 and a second cathode bond pad 222 are both arranged on the first face 200 along the third lateral edge 214. For simplicity in FIG. 13A, additional anode bond pads and cathode bond pads are not labeled, however, a plurality of first anode and cathode bond pads may be arranged along the second lateral edge 212 and a plurality of second anode and cathode bond pads may be arranged along the third lateral edge 214 for additional LED chip mounting regions. In this manner, anode and cathode bond pads may be aligned along opposing lateral edges to provide individual control to LED chips mounted on the submount 198. In other embodiments, anode and cathode bond pads may be aligned along a single edge of the submount 198. In order to individually control each of the LED chips that will be mounted in the LED chip mounting regions 204-1 to 204-3, each LED chip mounting region 204-1 to 204-3 is electrically connected with a unique pair of either the first anode bond pad 216 or the second anode bond pad 220 and either the first cathode bond pad 218 or the second cathode bond pad 222. A first electrically conductive anode path 224 extends between and is continuous with the first anode 206-1 and the first anode bond pad 216. A first electrically conductive cathode path 226 extends between and is continuous with the first cathode bond pad 218 and both of the first cathode 208-1 and the second cathode 208-2. A second electrically conductive anode path 228 extends between and is continuous with the second anode bond pad 220 and both of the second anode 206-2 and the third anode 206-3. Finally, a second electrically conductive cathode path 230 extends between and is continuous with the second cathode bond pad 222 and the third cathode 208-3. In this manner, an LED chip mounted to mounting region 204-1 may be electrically activated by electrically addressing the first anode bond pad 216 and the first cathode bond pad 218. An LED chip mounted to the mounting region 204-2 may be electrically activated by electrically addressing the second anode bond pad 220 and the first cathode bond pad 218. An LED chip mounted to mounting region 204-3 may be electrically activated by electrically addressing the second anode bond pad 220 and the second cathode bond pad 222. As with previous embodiments, depending on the configuration, the polarities may be reversed such that elements previously referred to as various types of anode elements may be cathode elements and elements previously referred to as anode elements may be cathode elements. Additionally, the first surface 200 may have space for an area 232 that includes identification or other information, including a quick response (QR) code, a bar code, or alphanumeric information.

In contrast to previous embodiments, the second face 202, or the backside of the submount 198, is free of electrically conductive paths. Accordingly, the entire second face 202 may be covered with a thermally conductive material for heat dissipation. In other embodiments, at least a portion of the second face 202 may be covered with a thermally conductive material. In still other embodiments, the second face 202 may not include additional materials, rather the second face 202 may be configured to be directly mounted to another surface.

Figure 14:
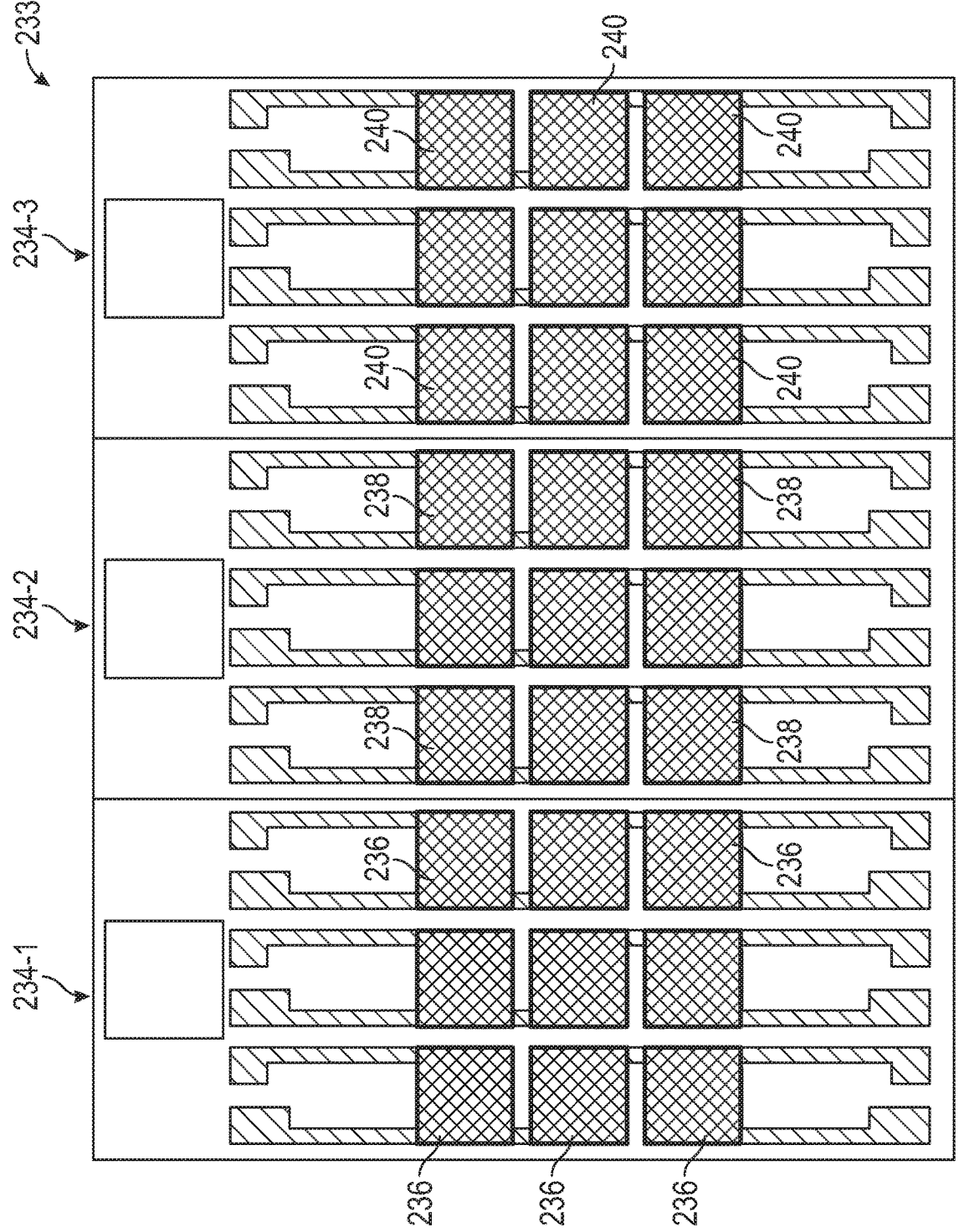
FIG. 14 is top view of a lighting device that includes a plurality of submounts that are positioned adjacent to one another.

FIG. 14 is top view of a lighting device 233 that includes a plurality of submounts 234-1 to 234-3 that are positioned adjacent to one another. The first submount 234-1, the second submount 234-2, and the third submount 234-3 are similar to the submount 198 of FIGS. 13A and 13B. A first plurality of LED chips 236 are mounted on the first submount 234-1, a second plurality of LED chips 238 are mounted on the second submount 234-2, and a third plurality of LED chips 240 are mounted on the third submount 234-3. For simplicity, only some of the LED chips 236, 238, 240 are labeled, however there are twenty-seven total LED chips 236, 238, 240 in FIG. 14. In other embodiments, the LED chips 236, 238, 240 may include any number of LED chips. The first plurality of LED chips 236, the second plurality of LED chips 238, and the third plurality of LED chips 240 collectively form an LED array that extends across the plurality of submounts 234-1 to 234-3. As with previous embodiments, each LED chip 236, 238, 240 of the LED array is spaced apart from at least one other LED chip 236, 238, 240 of the LED array by a first distance that is consistent for the LED array across the plurality of submounts 234-1 to 234-3.

According to embodiments disclosed herein, an LED device may include a plurality of submounts, each of which include a plurality of LED chips. As previously described, the plurality of LED chips on each of the submounts collectively forms an LED array across the plurality of submounts. In this manner, additional elements for the LED device may also be formed that extend across the plurality of submounts. For example, one or more light-altering materials as previously described may be continuous on and across each of the plurality of submounts. The one or more light-altering materials may be arranged around an entire perimeter of the LED array as well as in between individual LED chips of the LED array.

Figure 15:
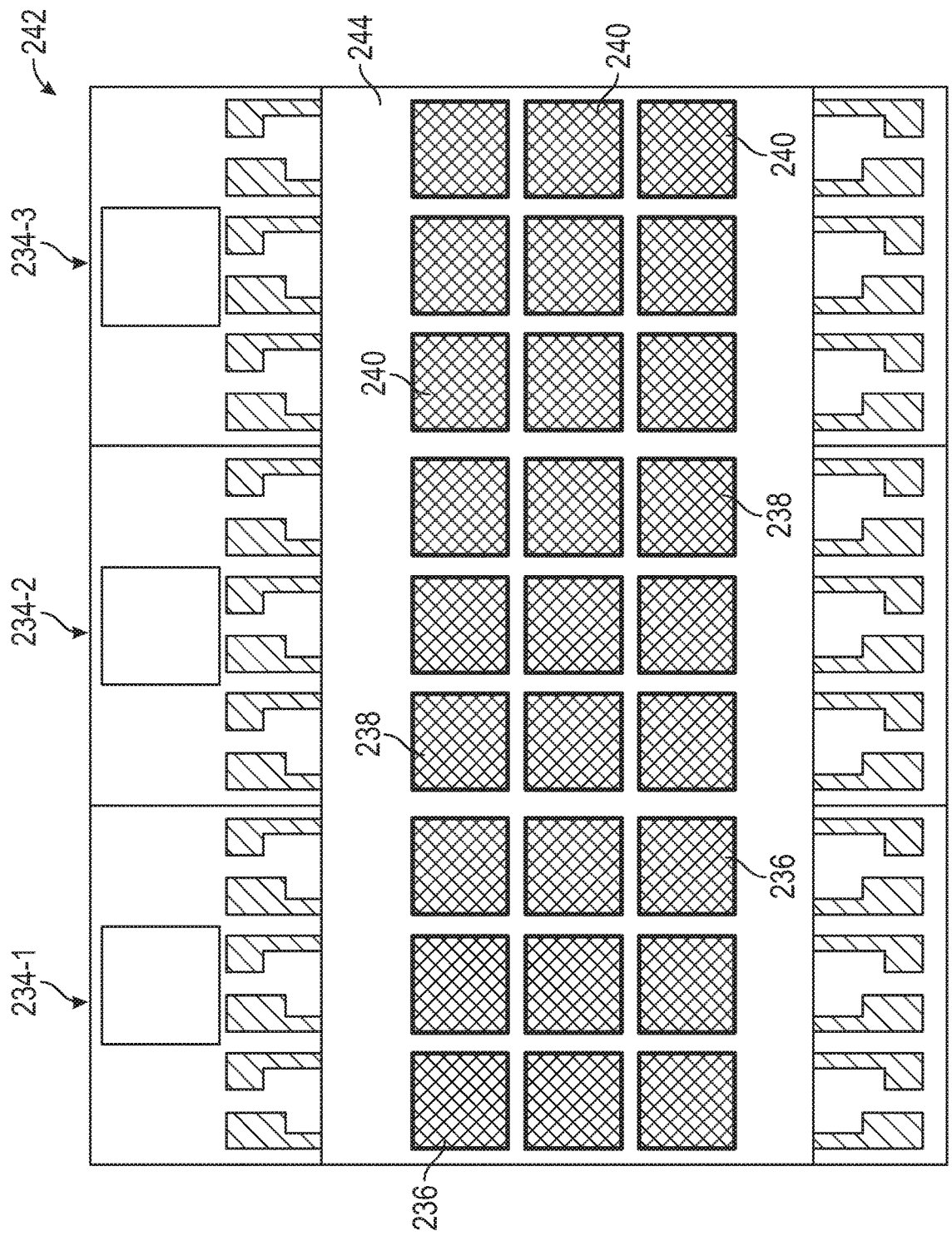
FIG. 15 is a top view of a lighting device that includes the plurality of submounts and the first plurality of LED chips, the second plurality of LED chips, and the third plurality of LED chips of FIG. 14 as well as a light-altering material.

FIG. 15 is a top view of a lighting device 242 that includes the plurality of submounts 234-1 to 234-3 and the first plurality of LED chips 236, the second plurality of LED chips 238, and the third plurality of LED chips 240 of FIG. 14. The LED chips 236, 238, and 240 collectively form an LED array. The lighting device 242 additionally includes a light-altering material 244 as previously described. The light-altering material 244 is continuous on and across the first submount 234-1, the second submount 234-2, and the third submount 234-3. In certain embodiments, the light-altering material 244 is formed after the plurality of submounts 234-1 to 234-3 are mounted or joined together. In other embodiments, each of the submounts 234-1 to 234-3 may include a portion of the light-altering material 244 before they are mounted or joined together. In this manner, the portions of the light-altering material 244 on each of the submounts 234-1 to 234-3 collectively form the light-altering material 244 that is continuous across the plurality of submounts 234-1 to 234-3. In certain embodiments where the submounts 234-1 to 234-3 include a portion of the light-altering material 244 before they are mounted or joined together, an additional application of light-altering material may be needed to fill in any gaps in the light-altering material 244 after the submounts 234-1 to 234-3 are assembled together. In certain embodiments, the light-altering material 244 is arranged around an entire perimeter of the first plurality of LED chips 236, the second plurality of LED chips 238, and the third plurality of LED chips 240. Additionally, the light-altering material 244 may be arranged between individual LED chips of the first plurality of LED chips 236, the second plurality of LED chips 238, and the third plurality of LED chips 240. Each LED chip of the first, second, and third plurality of LED chips 236, 238, 240 includes a face that is distal to the corresponding submount 234-1 to 234-3 on which it is mounted, and in certain embodiments, the light-altering material 244 does not cover the face. In certain embodiments, each LED chip of the first, second, and third plurality of LED chips 236, 238, 240 includes at least one of a growth substrate or a carrier substrate. As with previous embodiments, each of the LED chips 236, 238, 240 may include a wavelength conversion element as previously described, and the light-altering material 244 further does not cover a face of each wavelength conversion element that is distal to the corresponding submount 234-1 to 234-3 on which it is mounted. Each of the plurality of submounts 234-1 to 234-3 may be in contact with at least one other submount of the plurality of submounts 234-1 to 234-3. As previously described, each of the LED chips 236, 238, 240 may be arranged on the plurality of submounts 234-1 to 234-3 such that each LED chip 236, 238, 240 is laterally separated from at least one other LED chip 236, 238, 240 of the LED array by a first distance that is consistent through the LED array. In this manner, the lighting device 242 includes an LED array of individually addressable LED chips 236, 238, 240 with improved contrast as different ones of the LED chips 236, 238, 240 are electrically activated and electrically de-activated.

While the preceding figures illustrate anode and cathode bond pads aligned along opposing edges of a submount, the anode and cathode bond pads may be aligned along a single edge of the submount in certain embodiments. Additionally, multiple submounts with anode and cathode bond pads aligned along a single edge may be mounted or joined together to form a larger array as previously described. In certain embodiments, a lighting device includes at least a first submount with anode and cathode bond pads aligned along a single edge that is joined or mounted adjacent to at least a second submount with anode and cathode bond pads aligned along opposing edges.

According to embodiments disclosed herein, a lighting device may include a plurality of LED chips arranged on a submount. A light-altering material may be arranged around an entire perimeter of the plurality of LED chips as well as in between individual LED chips on the submount. In certain embodiments, the light-altering material may partially cover the submount, thereby leaving one or more bond pads uncovered in order to facilitate external electrical connections. The arrangement of the submount, the light-altering material, the plurality of LED chips, and one or more bond pads may provide a modular lighting device that can be operated by itself or placed together with other modular LED devices to form a larger lighting device with a larger combined LED array.

Figure 16:
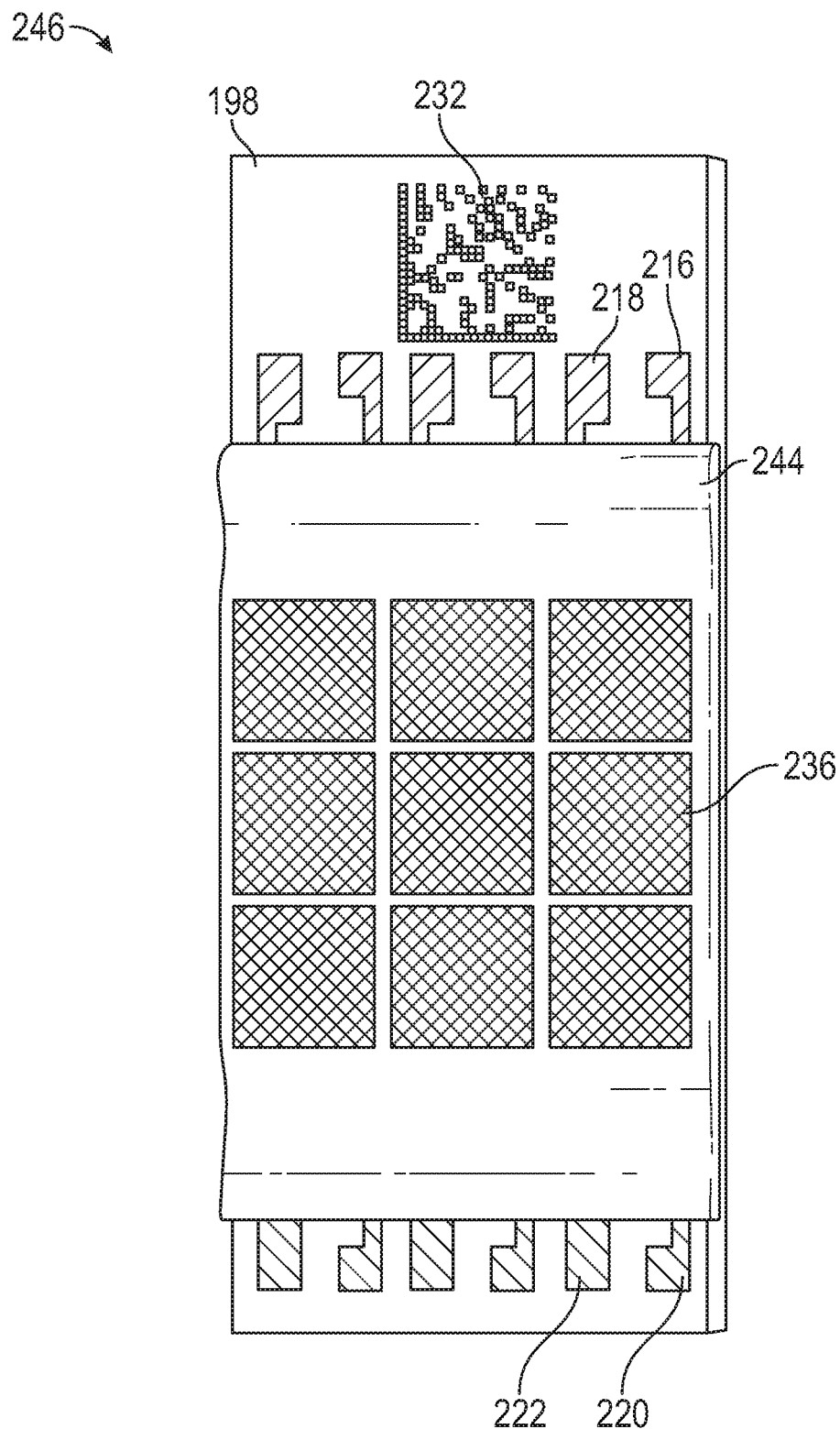
FIG. 16 is a top view of a lighting device, or an LED device, that includes the submount of FIG. 13A with the plurality of LED chips and the light-altering material of FIG. 15.

FIG. 16 is a top view of a lighting device 246, or an LED device, that includes the submount 198 of FIG. 13A, with the plurality of LED chips 236 and the light-altering material 244 of FIG. 15. As previously described, the submount 198 includes the first anode bond pad 216, the first cathode bond pad 218, the second anode bond pad 220, and the second cathode bond pad 222. For simplicity in FIG. 16, additional anode bond pads and cathode bond pads are not labeled. The submount 198 may also include the area 232 that includes identification or other information, including a quick response (QR) code, a bar code, or alphanumeric information. As illustrated, the light-altering material 244 is arranged around an entire perimeter of the plurality of LED chips 236 as well as in between individual LED chips 236 on the submount 198. Additionally, the first anode bond pad 216, the first cathode bond pad 218, the second anode bond pad 220, and the second cathode bond pad 222 are uncovered by the light-altering material 244 to provide bond pads for external electrical connections. In certain embodiments, the lighting device 246 may be operated on its own. In other embodiments, multiple lighting devices 246 may be placed together in a modular fashion to form a larger array similar to the lighting device 242 of FIG. 15. In this manner, each individual lighting device 246 includes a light-altering material 244 that is arranged in close proximity to or in contact with a light-altering material 244 from an adjacent lighting device 246.

As previously described, one or more light-altering materials may be provided between adjacent LED chips to improve contrast. The light-altering material may include light-reflective materials or particles that reflect, refract, or otherwise redirect light, light-absorbing materials that absorb light, and materials that act as a thixotropic agent. In certain embodiments, the light-altering material includes a material or particle that is light reflective or light refractive and light absorbing. For example, the light-altering material may include one or more nanoparticles, mesoparticles, nanowires, and/or mesowires that are configured to refract a portion of light from the LED chips while absorbing another portion of light from the LED chips. As used herein, the term "nanoparticle" generally refers to a particle with a particle size in a range of about 1 nm to about 100 nm, and the term "mesoparticle" generally refers to a particle with a particle size in a range of about 100 nm to about 1000 nm. In a similar manner, the terms "nanopowder" and "mesopowder" generally refer to powdered materials respectively having individual nanoparticles or mesoparticles. As used herein, the term "nanowire" generally refers to a wire structure having a diameter or width in a range of about 1 nm to about 100 nm and an elongated length. In certain embodiments, a nanowire may have a length to width ratio of at least 1000. As used herein, the term "mesowire" generally refers to a wire structure having a diameter or width in a range of about 100 nm to about 1000 nm and an elongated length. In certain embodiments, a mesowire may have a length to width ratio of at least 1000. Nanoparticles and mesoparticles may comprise particles of many different shapes including one or more combinations of wires, spheres, ovals, cubes, pyramids, as well as various asymmetric shapes.

Figure 17A:
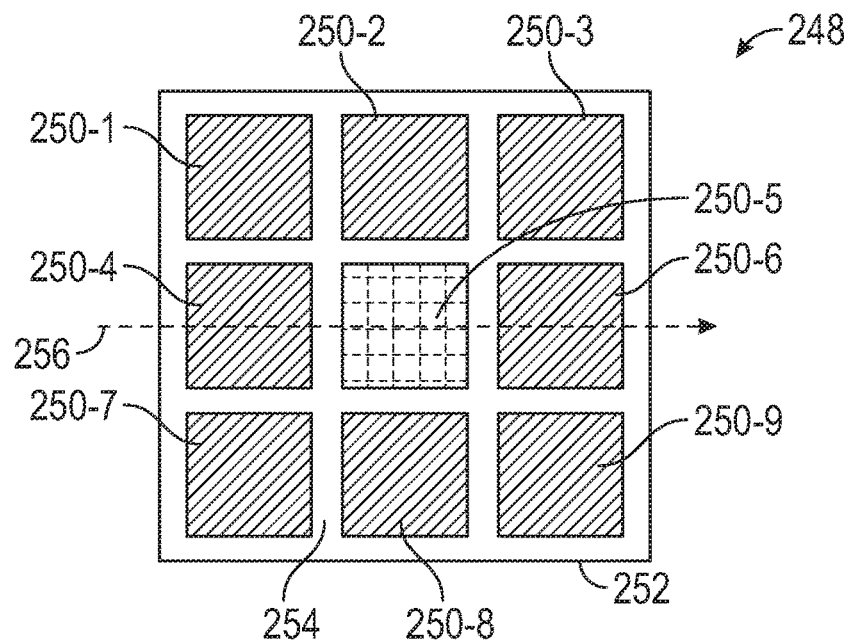
FIG. 17A is top view of an LED device with one or more LED chips arranged on a surface of a submount.

FIG. 17A is top view of an LED device 248 with one or more LED chips 250-1 to 250-9 arranged on a surface of a submount 252 as previously described. A light-altering material 254 is arranged around a perimeter of the one or more LED chips 250-1 to 250-9 as well as between individual LED chips of the one or more LED chips 250-1 to 250-9. For example, the light-altering material 254 is arranged around a perimeter or an entire perimeter of the LED chip 250-5. Additionally, the light-altering material 254 is arranged between the LED chip 250-5 and the other laterally separated LED chips 250-1 to 250-4 and 250-6 to 250-9. In certain embodiments, the light-altering material 254 is arranged around an entire perimeter of the group of LED chips 250-1 to 250-9. In certain embodiments, the light-altering material 254 may comprise at least one of a plurality of nanoparticles, a plurality of nanowires, or a plurality of mesowires suspended in a binder such as silicone or epoxy. The plurality of nanoparticles, nanowires, or mesowires may include many different materials including: metallic materials such as nickel (Ni), platinum (Pt), and gold (Au); semiconducting materials such as Si, indium phosphide (InP), and GaN; and insulating materials such as silicon dioxide ($SiO_2$) and $TiO_2$. The nanoparticles, nanowires, or mesowires may comprise light-refracting and light-absorbing properties when interacting with light from the one or more LED chips 250-1 to 250-9. In particular, an individual nanoparticle, nanowire, or mesowire may be configured to refract a portion of light and absorb another portion of light. In certain embodiments, the nanoparticles, nanowires, or mesowires comprise an index of refraction in a range of about 3 to about 5 for a wavelength of about 480 nm. In further embodiments, the nanoparticles, nanowires, or mesowires comprise an index of refraction of about 4 to about 5 for a wavelength of about 480 nm. In certain embodiments, the nanoparticles, nanowires, or mesowires comprise a material such as Si that has a color (e.g. brown, or other non-white and non-black colors) that is partially light absorbing. Accordingly, the nanoparticles, nanowires, or mesowires comprise a high index of refraction for light refraction and a color such as brown that is light-absorbing. A brown color or other non-black or non-white colors provides a narrower absorption spectrum than particles that are black. In this regard, the nanoparticles, nanowires, or mesowires may provide some light-absorbing properties to increase contrast between the LED chips 250-1 to 250-9 while also providing improved brightness when compared to light-absorbing particles that are black. Nanopowders and mesopowders with similar properties to the nanowires and the mesowires may also be present in the light-altering material 254. Nanopowders and mesopowders may comprise particles of many different shapes including one or more combinations of wires, spheres, ovals, cubes, pyramids, as well as various asymmetric shapes. The light-altering material 254 may additionally comprise a light-reflective and/or light-refractive material that includes at least one of fused silica, fumed silica, $TiO_2$, or metal particles suspended in the binder. In certain embodiments, the light-altering material 254 includes the following: a binder that comprises silicone with an index of refraction in a range of about 1.3 to about 1.6, or in a range of about 1.4 to about 1.55; a plurality of $TiO_2$ particles with an index of refraction in a range of about 2.4 to about 3.6; and a silicon nanowire/nanopowder or silicon mesowire/mesopowder mixture having an index of refraction of about 3 to about 5, or in a range of about 4 to about 5, where all of the index or refraction values are for a wavelength of about 480 nm. Accordingly, the light-altering material 254 may include a binder comprising a first index of refraction, one or more light-refracting particles comprising a second index of refraction, and one or more light-refracting and light-absorbing particles having a third index of refraction. In certain embodiments, the second index of refraction is at least two times greater, or in a range of at least two times greater to about three times greater than the first index of refraction. In certain embodiments, the third index of refraction is at least two and a half times greater, or in a range of at least two and a half times greater to about four times greater than the first index of refraction. In certain embodiments, the light-altering material 254 may further comprise metal particles. As previously described, some metal particles are generally more light-reflecting than light-refracting and accordingly have a lower index of refraction. In this regard, the metal particles may have a lower index of refraction than the binder. For example, the light-altering material 254 may further comprise at least one of Al particles that have an index of refraction of about 0.7 or Ag particles that have an index of refraction of about 0.05.

In certain embodiments, the one or more LED chips 250-1 to 250-9 further comprise one or more wavelength conversion elements as previously described. In particular, a first wavelength conversion element may be registered with the LED chip 250-1, a second wavelength conversion element may be registered with the LED chip 250-2, and so on. Each of the wavelength conversion elements may comprise a superstrate and a wavelength conversion element as previously described. In this manner, the light-altering material 254 may be arranged around an entire perimeter of each wavelength conversion element, around an entire perimeter of all wavelength conversion elements, as well as between individual wavelength conversion elements. In certain embodiments, the binder (e.g. silicone in certain embodiments) may comprise a weight percent that is in a range of about 10% to about 90% of the total weight of the light-altering material; the light-reflective and/or light-refractive material (e.g. $TiO_2$ in certain embodiments) may comprise a weight percent that is in a range of about 10% to about 90% of the total weight of the light-altering material; and the nanowires, mesowires, nanopowder, and/or mesopowder (e.g. Si in certain embodiments) may comprise a total weight percent that is in a range of about 0% to about 15% of the total weight of the light-altering material. In further embodiments, the binder may comprise a weight percent that is in a range of about 25% to about 70% of the total weight of the light-altering material; the light-reflective and/or light-refractive material may comprise a weight percent that is in a range of about 25% to about 70% of the total weight of the light-altering material; and the nanowires, mesowires, nanopowder, and/or mesopowder may comprise a weight percent that is in a range of about 0% to about 5% of the total weight of the light-altering material. In further embodiments, the nanowires, mesowires, nanopowder, and/or mesopowder may comprise a weight percent that is in a range of about greater than 0% to about 1% of the total weight of the light-altering material. A weight ratio of the light-reflective or light-refractive material to the binder may comprise a range of about 1:1 to about 2:1. A weight ratio of the nanowires, mesowires, nanoparticles, nanopowder, and/or mesopowder to the binder may comprise a range of about 1:400 to about 1:10. In certain embodiments, the light-altering material may comprise a generally white color with regions of non-white and non-black color (e.g. brown) due to the distribution of nanowires, mesowires, nanopowder, and/or mesopowder.

Figure 17B:
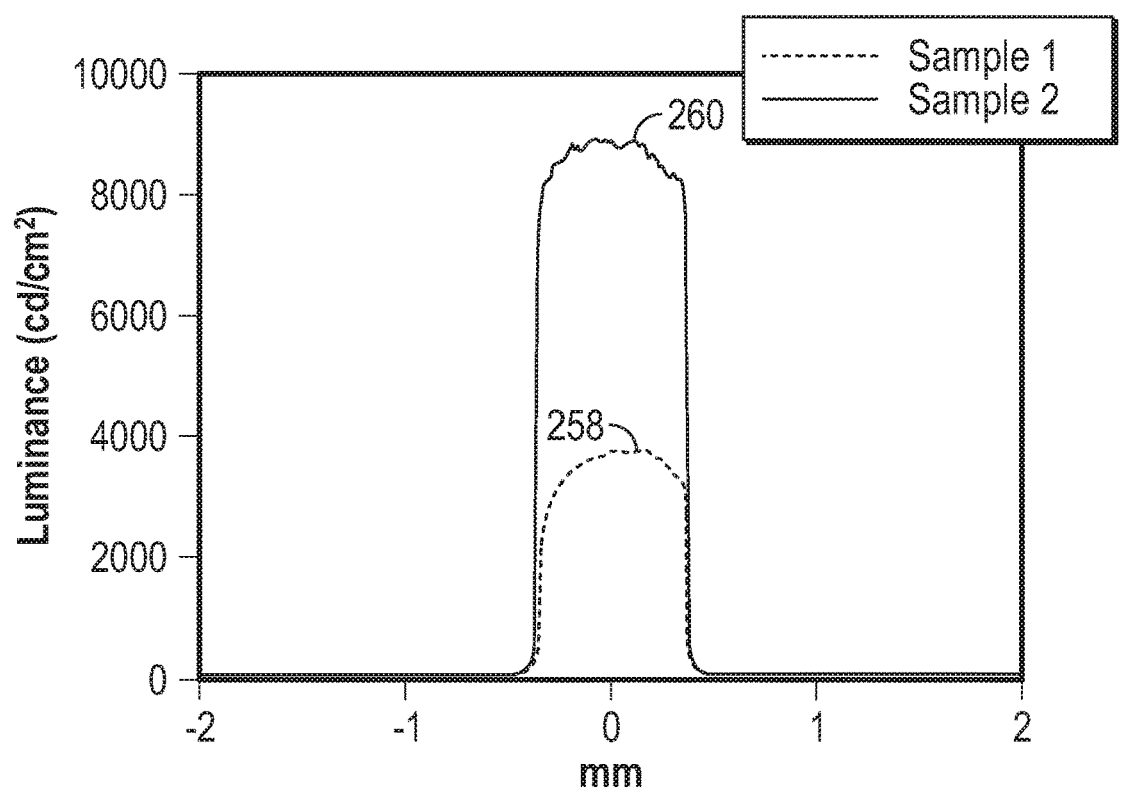
FIG. 17B is a line plot of an illumination profile when one of the LED chips of FIG. 17A is electrically activated, and the other LED chips of FIG. 17A are electrically deactivated for two samples with different light-altering materials.

FIG. 17B is a line plot of an illumination profile when the LED chip 250-5 is electrically activated, and the LED chips 250-1 to 250-4 and 250-6 to 250-9 are electrically deactivated for two samples with different light-altering materials (254 of FIG. 17A). The y-axis of the plot is luminance in candela per square centimeter ($cd/cm^2$) and the x-axis is the relative distance in millimeters (mm) a sensor moves across the plurality of LED chips 250-1 to 250-9 in a direction as indicated by a dashed line 256 of FIG. 17A. In FIG. 17B, Sample 1 represents the LED device 248 of FIG. 17A where the light-altering material 254 comprises black particles of carbon (also referred to as carbon black), and $TiO_2$ particles in a binder of silicone. The black particles of carbon have a weight percent of about 0.7% of the total weight of the light-altering material 254. The $TiO_2$ and silicone of the remainder of the light-altering material 254 are configured in roughly equal amounts. For Sample 1, the LED chips 250-1 to 250-9 are laterally separated from each other by about 0.1 mm. For Sample 2, the black particles of carbon are replaced with a mixture of silicon nanowires and silicon nanopowder that has a combined weight percent of about 0.7% and the $TiO_2$ and the silicone amounts are unchanged. In Sample 2, the LED chips 250-1 to 250-9 are laterally separated from each other by about 0.7 mm. In the plot of FIG. 17B, a first high luminance area 258 indicates the relative position of the LED chip 250-5 that is electrically activated in Sample 1, and a second high luminance area 260 indicates the relative position of the LED chip 250-5 that is electrically activated in Sample 2. At x-axis values of about −0.5 mm and about 0.5 mm, the luminance values sharply decrease, indicating good contrast for both Sample 1 and Sample 2 between the electrically activated LED chip 250-5 and the electrically deactivated LED chips 250-4, 250-6. Notably, Sample 2 has a much higher luminance value than Sample 1, indicating that more light is detected from the LED chip 250-5 while still maintaining good contrast with the adjacent LED chips 250-4, 250-6. Additionally, Sample 2 is able to achieve this performance with a closer LED chip spacing.

Figure 18:
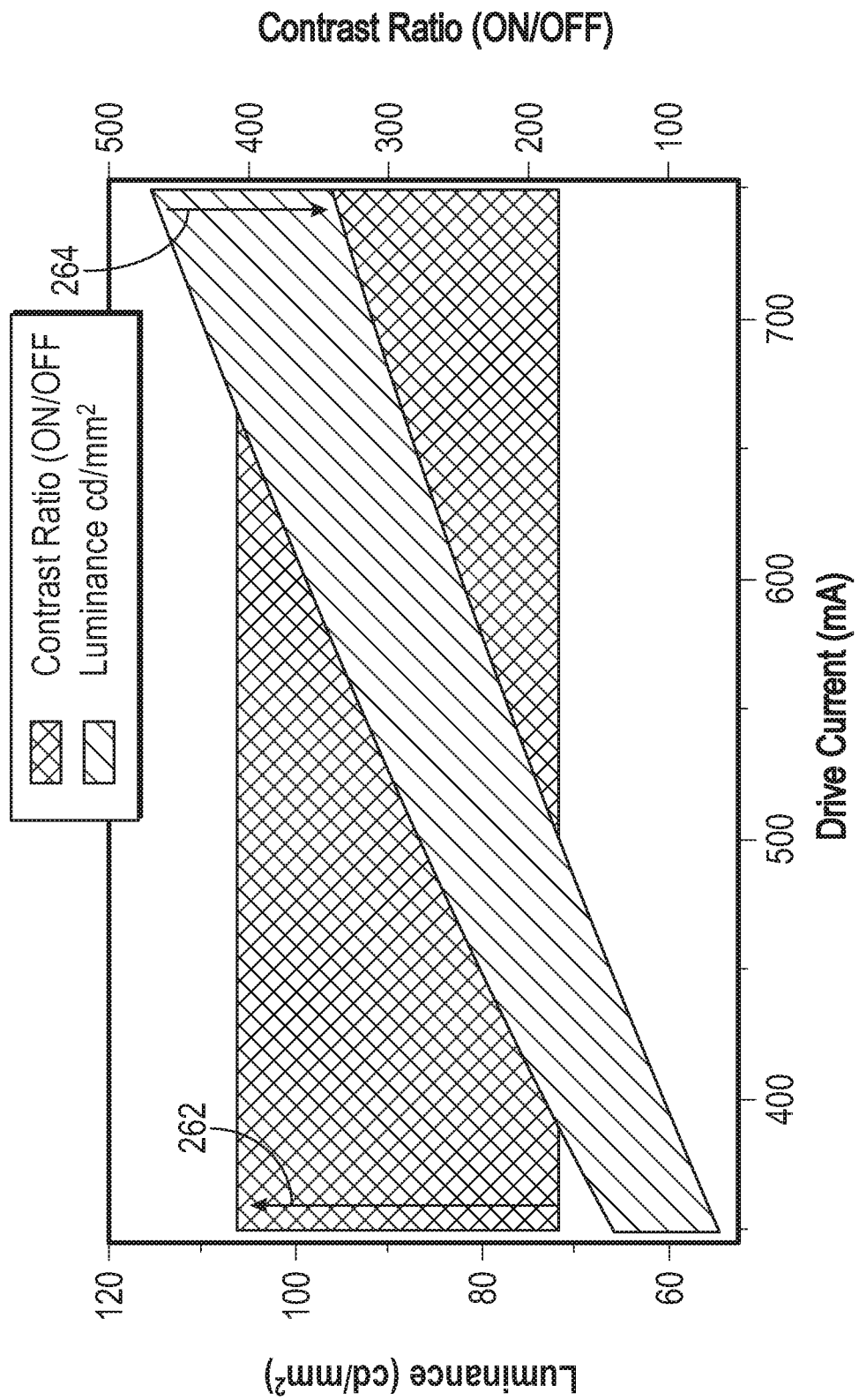
FIG. 18 is a comparison plot showing the relationship of varying weight percentages of a silicon nanowire/nanopowder mixture on luminance and contrast ratio.

In order to evaluate how the weight percent of a mixture of silicon nanowires and silicon nanopowder in a light-altering material impacts device performance, samples with various weight percents were created and tested. The samples were configured in a similar manner to the lighting device 246 of FIG. 16. FIG. 18 is a comparison plot showing the relationship of varying weight percents of a silicon nanowire/nanopowder mixture on luminance and contrast ratio in a lighting device. The x-axis of the plot represents the drive current for the lighting device in milliamps (mA). The primary y-axis of the plot is luminance in candela per square millimeters ($cd/mm^2$). The secondary y-axis represents arbitrary units of a contrast ratio as defined by a ratio of luminance between an electrically activated LED chip (on) and an adjacent LED chip that is electrically deactivated (off). A higher contrast ratio indicates a higher delta between the measured luminance of the electrically activated LED chip compared to the electrically deactivated LED chip. As previously described, the silicon nanowires/nanopowder mixture may have a variety of weight percents of the total light-altering material depending on the desired application. For the purposes of FIG. 18, silicon nanowires/nanopowder weight percents in a range from greater than 0% to about 1% were measured. In the comparison plot, an arrow 262 indicates the direction of increasing weight percent for the silicon nanowires/nanopowder mixture from greater than 0% to about 1% and the corresponding relationship with contrast ratio. As illustrated, for a fixed drive current, the contrast ratio increases as the weight percent of the silicon nanowires/nanopowder mixture increases. Additionally, for a fixed silicon nanowires/nanopowder mixture weight percent, the contrast ratio remains relatively the same as the drive current increases. An arrow 264 indicates the direction of increasing weight percent for the silicon nanowires/nanopowder mixture from greater than 0% to about 1% and the corresponding relationship with luminance. For a fixed drive current, the luminance decreases as the weight percent of the silicon nanowires/nanopowder mixture increases and for a fixed weight percent of the silicon nanowires/nanopowder mixture, the luminance increases with increased drive current. As shown, there is a trade-off between contrast ratio and luminance as the weight percent of the silicon nanowires/nanopowder mixture is increased. In this manner, the amount of a silicon nanowires/nanopowder mixture in a light-altering material may be tailored based on a desired application.

According to embodiments disclosed herein, a lighting device may include a light-altering material that is arranged between LED chips to provide improved contrast. The light-altering material may include a binder with one or more types of particles that are configured to alter light emitted from the LED chips. When light from the LED chips interacts with the particles, the light may be altered in a variety of manners depending on various configurations of the particles. In certain embodiments, some particles may be configured to substantially refract light from the LED chips, while other particles may be configured to refract light and absorb light from the LED chips, and yet other particles may be configured to substantially reflect light from the LED chips. As previously described, fused silica, fumed silica, and $TiO_2$ are examples of particles that may be configured to substantially refract light. Nanowires, mesowires, nanoparticles, mesoparticles, nanopowder and mesopowder of silicon or other materials are examples of particles that may be configured to partially refract and partially absorb light, and Al or Ag particles are examples of particles that may be configured to substantially reflect light. In certain embodiments, one or more combinations of different particle types may be combined within the light-altering material such that light from the LED chips that enters the light-altering material may interact with one or more of the different particle types. In this manner, in certain embodiments, an LED device comprises a submount; a first LED chip and a second LED chip on a surface of the submount; wherein the first LED chip is laterally separated from the second LED chip on the surface; and a light-altering material arranged between the first LED chip and the second LED chip on the submount. In certain embodiments, the light-altering material comprises: a binder; one or more first particles configured to substantially refract light emitted from the first LED chip and the second LED chip; and one or more second particles configured to refract light and absorb light emitted from the first LED chip and the second LED chip. In certain embodiments, the light-altering material further comprises one or more third particles configured to substantially reflect light emitted from the first LED chip and the second LED chip.

Figure 19A:
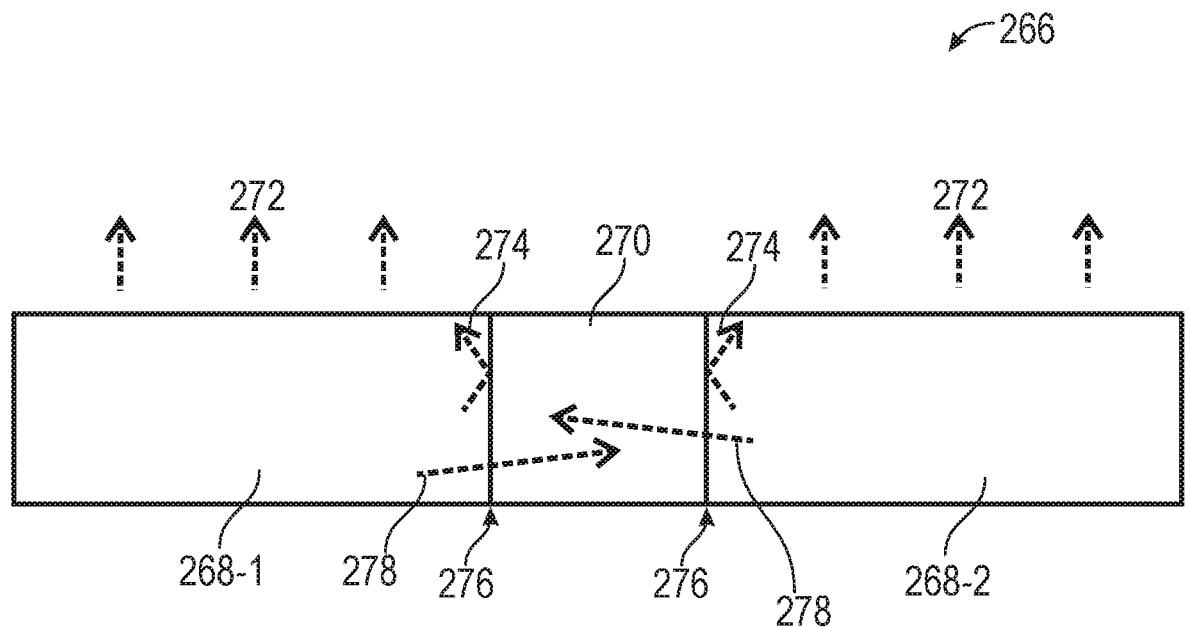
FIGS. 19A and 19B illustrate possible interactions of light within an LED device as disclosed herein.
Figure 19B:
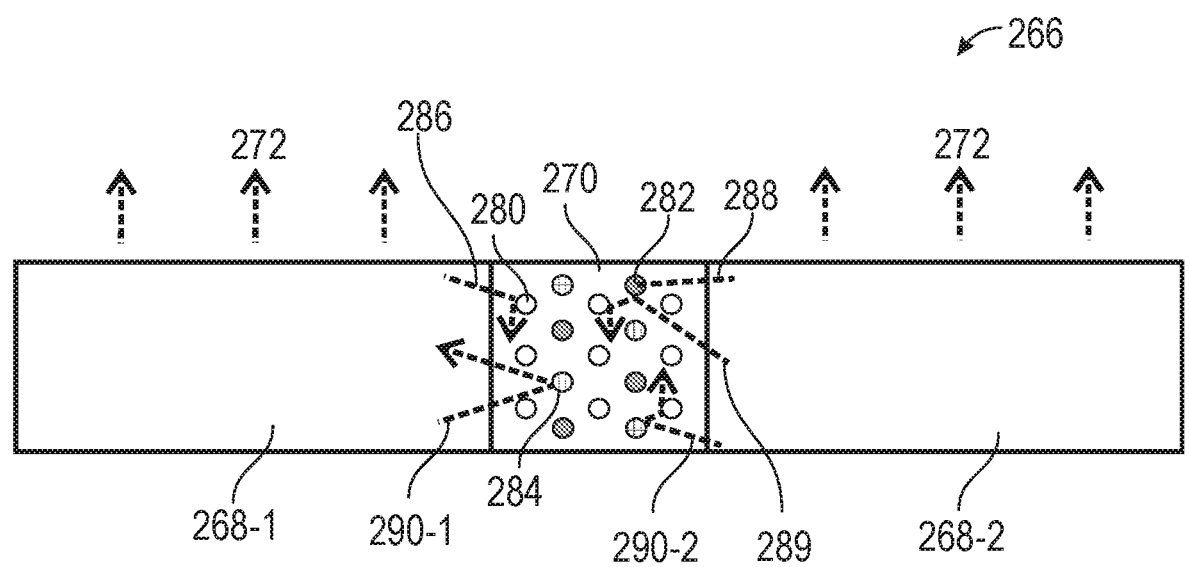

FIGS. 19A and 19B illustrate possible interactions of light within an LED device 266 as disclosed herein. The LED device 266 includes first and second LED chips 268-1, 286-2 and a light-altering material 270 that is arranged between the LED chips 268-1, 268-2. In FIG. 19A, the light-altering material 270 is illustrated without particles to illustrate light interactions that may occur between the LED chips 268-1, 268-2 and a binder material of the light-altering material 270. As previously described, the binder material may include silicone with an index of refraction in a range of about 1.3 to about 1.6, and the LED chips 268-1, 286-2 may include sapphire material with an index of refraction of about 1.8 or silicon carbide with an index of refraction of about 2.6. The LED chips 268-1, 286-2 may also include other materials and layers of materials such as wavelength conversion elements or other lumiphoric materials. Light emitting from the LED chips 268-1, 268-2 may emit or be redirected in all directions before exiting the LED chips 268-1, 268-2. Some of the light may exit in a desirable primary emission direction 272, while other portions of light may attempt to travel laterally from one LED chip 268-1 to another LED chip 268-2 where it may have various interactions with the light-altering material 270. One or more first light paths 274 may reach an interface 276 between the LED chips 268-1, 268-2 and the light-altering material 270 with a low angle of incidence and refract back within the LED chips 268-1, 268-2 and possibly toward the primary emission direction 272. One or more second light paths 278 may reach the interface 276 with a higher angle of incidence and continue traveling through the light-altering material 270. If the one or more second light paths 278 ultimately exit between the LED chips 268-1, 268-2 or into the other of the LED chips 268-1, 268-2, then corresponding photons may contribute to parasitic contrast loss. In FIG. 19B, one or more first particles 280, one or more second particles 282, and one or more third particles 284 are illustrated in the light-altering material 270 and between the LED chips 268-1, 268-2. In certain embodiments, the one or more first particles 280 are configured to substantially reflect or refract light from the LED chips 268-1, 268-2, the one or more second particles 282 are configured to reflect or refract light and absorb light from the LED chips 268-1, 268-2, and the one or more third particles 284 are configured to substantially reflect light from the LED chips 268-1, 268-2. In this regard, the one or more first particles 280 may comprise a reflectance percentage in a range from about 80% to about 100% for light emitted from the LED chips 268-1, 268-2. In further embodiments, the one or more first particles 280 may comprise a reflectance percentage in a range from about 90% to about 100% for light emitted from the LED chips 268-1, 268-2. The one or more second particles 282 may comprise a reflectance percentage in a range from about 20% to about 70%, or a range from about 30% to about 60%, or a range from about 35% to about 50% for light emitted from the first LED chip and the second LED chip. As with previous embodiments, the one or more first particles 280 may comprise a weight percent that is in a range of about 10% to about 90%, or in a range of about 25% to about 70% of a total weight of the light-altering material. The one or more second particles 282 may comprise a weight percent that is in a range of about greater than 0% to about 15%, or greater than 0% to about 10%, or greater than 0% to about 5%, or greater than 0% to about 1% of a total weight of the light-altering material. In certain embodiments, a weight ratio of the one or more first particles 280 to the binder may comprise a range of about 1:1 to about 2:1. A weight ratio of the one or more second particles 282 to the binder may comprise a range of about 1:400 to about 1:10. One or more third light paths 286 may enter the light-altering material 270 from the first LED chip 268-1 and interact with the one or more first particles 280 and refract away from the second LED chip 268-2. One or more fourth light paths 288 may enter the light-altering material 270 and interact with the one or more second particles 282 at an angle of incidence such that photons in the one or more fourth light paths 288 may be absorbed. The one or more second particles 282 may additionally receive photons at one or more fifth light paths 289 that have an angle of incidence where photons may be refracted. One or more sixth light paths 290-1, 290-2 may interact with the one or more third particles 284 in a manner that photons will reflect. As illustrated by the light paths 289 and 290-2, photons may be redirected multiple times by one or more of the different particle types 280, 282, 284 before exiting in the primary emission direction 272 or being lost to absorption. In some examples, photons may be redirected back into the respective LED chip 268-1, 268-2 before exiting in the primary emission direction 272, thereby improving luminance in the primary emission direction 272. In addition to configurations where the light-altering material 270 includes the one or more first particles 280, the one or more second particles 282, and the one or more third particles 284, the light-altering material 270 may comprise different combinations of particles. For example, the light-altering material 270 may comprise one or more first particles 280 and one or more second particles 282 without the one or more third particles 284 in some embodiments. In other embodiments, the light-altering material 270 may comprise one or more first particles 280 and one or more third particles 284 without the one or more second particles 282. Additionally, the light-altering material 270 may comprise one or more second particles 282 and one or more third particles 284 in other embodiments without the one or more first particles 280.

Those skilled in the art will recognize improvements and modifications to the preferred embodiments of the present disclosure. All such improvements and modifications are considered within the scope of the concepts disclosed herein and the claims that follow.

What is claimed is:
1. A light emitting diode (LED) device comprising:
   a submount;
   a first LED chip on a surface of the submount; and
   a first light-altering material arranged around a perimeter of the first LED chip, wherein the first light-altering material comprises a plurality of nanowires and a plurality of mesowires in a binder, wherein the plurality of nanowires and the plurality of mesowires are configured to primarily absorb visible light in a first wavelength range and primarily refract visible light in a second wavelength range that is different than the first wavelength range, wherein the plurality of nanowires and the plurality of mesowires comprise a mixture that is configured with an index of refraction in a range from 3 to 5 for a wavelength of 480 nanometers (nm).
2. The LED device of claim 1, wherein the plurality of nanowires comprises silicon nanowires.
3. The LED device of claim 1, wherein the plurality of mesowires comprises silicon mesowires.
4. The LED device of claim 1, wherein the first light-altering material further comprises at least one of a nanopowder or a mesopowder.
5. The LED device of claim 4, wherein a total weight percent of the plurality of nanowires, the plurality of mesowires, the nanopowder, or the mesopowder is in a range of greater than 0% to 15% of a total weight of the first light-altering material.
6. The LED device of claim 1, wherein the first light-altering material further comprises at least one of fused silica, fumed silica, titanium dioxide ($TiO_2$), or metal particles in the binder.
7. The LED device of claim 1, further comprising a first wavelength conversion element registered with the first LED chip, wherein the first wavelength conversion element comprises a first superstrate and a first lumiphoric material that is arranged between the first superstrate and the first LED chip.
8. The LED device of claim 7, wherein the first light-altering material is further arranged around a perimeter of the first wavelength conversion element.
9. The LED device of claim 1, further comprising a second LED chip on the surface of the submount and wherein the first light-altering material is arranged between the first LED chip and the second LED chip.
10. The LED device of claim 1, wherein the first light-altering material comprises the plurality of nanowires and a plurality of particles that are configured to primarily refract visible light.

11. The LED device of claim 10, wherein the plurality of nanowires comprises nanowires that are non-white and non-black in color and the plurality of particles comprises white particles.

12. A light emitting diode (LED) device comprising:
   a submount;
   a first LED chip and a second LED chip on a surface of the submount, wherein the first LED chip is laterally separated from the second LED chip on the surface; and
   a first light-altering material arranged between the first LED chip and the second LED chip on the submount, wherein the first light-altering material comprises a plurality of nanoparticles in a binder, and the plurality of nanoparticles is configured to primarily absorb visible light in a first wavelength range and primarily refract visible light in a second wavelength range that is different than the first wavelength range, wherein the plurality of nanoparticles comprises a reflectance percentage in a range from 35% to 50% for light emitted from the first LED chip and the second LED chip.

13. The LED device of claim 12, wherein the plurality of nanoparticles comprises silicon nanoparticles.

14. The LED device of claim 13, wherein a total weight percent of the plurality of nanoparticles is in a range of greater than 0% to 15% of a total weight of the first light-altering material.

15. The LED device of claim 12, wherein the plurality of nanoparticles comprise shapes including one or more combinations of wires, spheres, ovals, cubes, pyramids, and asymmetric shapes.

16. The LED device of claim 12, wherein the first light-altering material further comprises at least one of fused silica, fumed silica, titanium dioxide ($TiO_2$), or metal particles in the binder.

17. The LED device of claim 12, wherein the first light-altering material is arranged around an entire perimeter of the first LED chip and around an entire perimeter of the second LED chip.

18. The LED device of claim 12, further comprising:
   a first wavelength conversion element registered with the first LED chip, wherein the first wavelength conversion element comprises a first superstrate and a first lumiphoric material that is arranged between the first superstrate and the first LED chip; and
   a second wavelength conversion element registered with the second LED chip, wherein the second wavelength conversion element comprises a second superstrate and a second lumiphoric material that is arranged between the second superstrate and the second LED chip.

19. The LED device of claim 18, wherein the first light-altering material is further arranged between the first wavelength conversion element and the second wavelength conversion element.

20. The LED device of claim 12, wherein the first light-altering material further comprises a plurality of particles that are configured to primarily refract visible light.

21. The LED device of claim 20, wherein the plurality of nanoparticles comprises nanoparticles that are non-white and non-black in color and the plurality of particles comprises white particles.

22. A light emitting diode (LED) device comprising:
   a submount;
   a first LED chip and a second LED chip on a surface of the submount, wherein the first LED chip is laterally separated from the second LED chip on the surface; and
   a first light-altering material arranged between the first LED chip and the second LED chip on the submount, wherein the first light-altering material comprises:
      a binder comprising a first index of refraction;
      one or more first particles comprising a second index of refraction; and
      a plurality of second particles comprising a mixture of nanoparticles and mesoparticles with a third index of refraction, wherein the plurality of second particles are configured to primarily absorb visible light in a first wavelength range and primarily refract visible light in a second wavelength range that is different than the first wavelength range;
      wherein the second index of refraction is at least two times greater than the first index of refraction, and the third index of refraction is at least two and a half times greater than the first index of refraction, wherein the third index of refraction is in a range from 3 to 5 for a wavelength of 480 nanometers (nm).

23. The LED device of claim 22, wherein the second index of refraction is in a range of at least two times greater to three times greater than the first index of refraction, and the third index of refraction is in a range of at least two and a half times greater to four times greater than the first index of refraction.

24. The LED device of claim 22, wherein the one or more first particles comprise at least one of fused silica, fumed silica, and titanium dioxide ($TiO_2$).

25. The LED device of claim 22, wherein the plurality of second particles comprise at least one of nanowires and mesowires.

26. The LED device of claim 22, wherein the first light-altering material is arranged around an entire perimeter of the first LED chip and around an entire perimeter of the second LED chip.

27. The LED device of claim 22, wherein the first light-altering material further comprises metal particles.

28. A light emitting diode (LED) device comprising:
   a submount;
   a first LED chip and a second LED chip on a surface of the submount, wherein the first LED chip is laterally separated from the second LED chip on the surface; and
   a light-altering material arranged between the first LED chip and the second LED chip on the submount, wherein the light-altering material comprises:
      a binder;
      one or more first particles configured to primarily reflect or refract light emitted from the first LED chip and the second LED chip; and
      one or more second particles configured to primarily reflect or refract a first portion of light emitted from the first LED chip and the second LED chip and primarily absorb a second portion of light emitted from the first LED chip and the second LED chip, wherein the one or more second particles comprise a reflectance percentage in a range from 35% to 50% for light emitted from the first LED chip and the second LED chip.

29. The LED device of claim 28, wherein the one or more first particles comprise at least one of fused silica, fumed silica, or titanium dioxide ($TiO_2$).

30. The LED device of claim 28, wherein the one or more second particles comprise at least one of nanowires, mesowires, nanoparticles, mesoparticles, nanopowder, or mesopowder.

31. The LED device of claim 28, wherein the light-altering material further comprises one or more third particles configured to primarily reflect light emitted from the first LED chip and the second LED chip.

32. The LED device of claim 31, wherein the one or more third particles comprise metal particles.

33. The LED device of claim 28, wherein the one or more first particles comprise a reflectance percentage in a range from 80% to 100% for light emitted from the first LED chip and the second LED chip.

34. The LED device of claim 28, wherein the one or more first particles comprise a weight percent that is in a range of 10% to 90% of a total weight of the light-altering material.

35. The LED device of claim 28, wherein the one or more first particles comprise a weight percent that is in a range of 25% to 70% of a total weight of the light-altering material.

36. The LED device of claim 28, wherein the one or more second particles comprise a weight percent that is in a range of greater than 0% to 15% of a total weight of the light-altering material.

37. The LED device of claim 28, wherein the one or more second particles comprise a weight percent that is in a range of greater than 0% to 10% of a total weight of the light-altering material.

38. The LED device of claim 28, wherein the one or more second particles comprise a weight percent that is in a range of greater than 0% to 5% of a total weight of the light-altering material.

39. The LED device of claim 28, wherein the one or more second particles comprise a weight percent that is in a range of greater than 0% to 1% of a total weight of the light-altering material.

* * * * *